(12) United States Patent
Kitagawa

(10) Patent No.: US 9,082,565 B2
(45) Date of Patent: Jul. 14, 2015

(54) COMPOSITE SWITCH AND PORTABLE DEVICE WITH SAME

(75) Inventor: Takeharu Kitagawa, Tokyo (JP)

(73) Assignee: LENOVO INNOVATIONS LIMITED (HONG KONG), Quarry Bay (HK)

( * ) Notice: Subject to any disclaimer, the term of this patent is extended or adjusted under 35 U.S.C. 154(b) by 1108 days.

(21) Appl. No.: 12/922,311

(22) PCT Filed: Apr. 28, 2009

(86) PCT No.: PCT/JP2009/058359
§ 371 (c)(1),
(2), (4) Date: Sep. 13, 2010

(87) PCT Pub. No.: WO2009/133890
PCT Pub. Date: Nov. 5, 2009

(65) Prior Publication Data
US 2011/0006928 A1     Jan. 13, 2011

(30) Foreign Application Priority Data

Apr. 28, 2008 (JP) .................. 2008-117431
Jul. 9, 2008 (JP) .................. 2008-179384

(51) Int. Cl.
| H03K 17/94 | (2006.01) |
| H01H 13/807 | (2006.01) |
| G06F 1/16 | (2006.01) |
| G06F 3/02 | (2006.01) |
| G06F 3/0338 | (2013.01) |
| H03K 17/96 | (2006.01) |
| H04M 1/23 | (2006.01) |

(52) U.S. Cl.
CPC ............ *H01H 13/807* (2013.01); *G06F 1/169* (2013.01); *G06F 1/1626* (2013.01); *G06F 1/1662* (2013.01); *G06F 3/0213* (2013.01); *G06F 3/0338* (2013.01); *H01H 2221/012* (2013.01); *H01H 2225/002* (2013.01); *H01H 2225/018* (2013.01); *H01H 2231/022* (2013.01); *H03K 17/962* (2013.01); *H03K 17/964* (2013.01); *H03K 17/9622* (2013.01); *H03K 17/9643* (2013.01); *H04M 1/233* (2013.01)

(58) Field of Classification Search
CPC ...................................... G06F 1/1626
USPC ........................... 341/20, 22; 345/157
See application file for complete search history.

(56) References Cited

U.S. PATENT DOCUMENTS 6,399,904 B1 * 6/2002 Mimata .................. 200/6 A
6,670,562 B2 * 12/2003 Kaneko .................. 200/1 B
(Continued)

FOREIGN PATENT DOCUMENTS

CN    1669102 A    9/2005
CN    1886714 A    12/2006
(Continued)

OTHER PUBLICATIONS

International Search Report for PCT/JP2009/058359 mailed Aug. 11, 2009.
(Continued)

*Primary Examiner* — Amine Benlagsir

(57) ABSTRACT

A composite switch comprises: a first switch that operates by applying a first load to a first key; and a second switch that operates by applying a second load to a second key disposed on the first key.

17 Claims, 35 Drawing Sheets

(56) References Cited

U.S. PATENT DOCUMENTS

| | | |
|---|---|---|
| 7,429,976 B2 * | 9/2008 | Harley et al. .................. 345/157 |
| 7,432,619 B2 * | 10/2008 | Voll et al. ....................... 307/147 |
| 7,512,671 B1 * | 3/2009 | Gladwin et al. ............... 709/219 |
| 2002/0056611 A1 * | 5/2002 | Oba et al. ........................... 200/4 |
| 2002/0124197 A1 * | 9/2002 | Atkinson ........................ 713/322 |
| 2003/0010609 A1 | 1/2003 | Kaneko |
| 2003/0048852 A1 * | 3/2003 | Hwang et al. ............. 375/240.26 |
| 2003/0146907 A1 * | 8/2003 | Boals et al. .................... 345/179 |
| 2003/0188049 A1 * | 10/2003 | Dickens ............................. 710/8 |
| 2004/0080671 A1 * | 4/2004 | Siemens et al. ............... 348/473 |
| 2004/0133716 A1 * | 7/2004 | Lee ................................. 710/72 |
| 2005/0044266 A1 * | 2/2005 | O'Neil ........................... 709/238 |
| 2005/0063108 A1 * | 3/2005 | Voll et al. ......................... 361/18 |
| 2005/0110755 A1 | 5/2005 | Harley et al. |
| 2005/0151626 A1 * | 7/2005 | Shin ........................... 340/310.01 |
| 2007/0259697 A1 * | 11/2007 | Griffin et al. ................. 455/566 |
| 2007/0283379 A1 * | 12/2007 | Earl ................................ 725/13 |
| 2007/0284949 A1 * | 12/2007 | Voll et al. ....................... 307/147 |
| 2009/0058802 A1 * | 3/2009 | Orsley ........................... 345/157 |
| 2012/0073944 A1 | 3/2012 | Kobayashi et al. |

FOREIGN PATENT DOCUMENTS

| | | |
|---|---|---|
| JP | 2001143567 A | 5/2001 |
| JP | 2001312944 A | 11/2001 |
| JP | 2004062447 A | 2/2004 |
| JP | 2005317337 A | 11/2005 |
| JP | 2005339835 A | 12/2005 |
| JP | 2008053228 A | 3/2008 |

OTHER PUBLICATIONS

Chinese Office Action for CN200980109130.6 dated Sep. 26, 2012.

Chinese Search Report for CN Application No. 2009801091306 dated on Aug. 2, 2013.

* cited by examiner (a)

(b)

(a)

(b)

COMPOSITE SWITCH AND PORTABLE DEVICE WITH SAME

REFERENCE TO RELATED APPLICATION

This application is the National Phase of PCT/JP2009/058359, filed Apr. 28, 2009, which claims the benefit of Japanese Patent Applications No. 2008-117431 filed Apr. 28, 2008 and No. 2008-179384 filed Jul. 9, 2008, which are hereby incorporated by reference herein in their entirety.

TECHNICAL FIELD

This invention relates to a composite switch and a portable device with same. More particularly, the invention relates to a composite switch with enhanced input operability and a portable device with same.

BACKGROUND

The main functions of a conventional cellular phone have been a telephone call function and an address registration function. Since operations required in using these functions are nothing but input of numbers and simple characters, only a numeric key called "ten key" has been necessary as an input key in the conventional cellular phone.

However, since a mail function, menu function, internet function, etc., have been added to a recent cellular phone, input operation required in using these function has become diverse and complex. Therefore, not only the ten key but also a cross key or menu key has become necessary in the cellular phone.

A "jog" has appeared as a direction key of the cross key. The "jog" makes it possible to input a predetermined direction quickly in order to reduce input time. Moreover, an analog pointer that makes it possible to input any direction smoothly and quickly has appeared as a center key of the cross key in order to simplify an input operation and reduce input time.

Recently, since not only a complex mail function, menu function and internet function but also a game function, camera function, music play function, television function, etc. have been added to a cellular phone, there is a need to further simplify input operation and reduce input time.

FIG. 1 illustrates, as an example, a front view of a conventional cellular phone. Referring to FIG. 1, the cellular phone comprises a housing A 111 and a housing B 112. The housing A 111 comprises keys 114. The housing B 112 comprises a display screen.

Referring to FIG. 2, a cross key 115, ten key 116 and menu key 117 are provided as the keys 114. Referring to (a) of FIG. 2, in this cellular phone, the cross key 115 is arranged in the upper side of the key plane of the housing A 111 (plane on which keys are arranged). Referring to (b) of FIG. 2, in this cellular phone, the ten key 116 is arranged in the lower side of the cross key 115 on the key plane of the housing A 111. Referring to (c) of FIG. 2, the menu key 117 is arranged just outside the cross key 115 on the key plane of the housing A 111.

Referring to (a) of FIG. 3, in the conventional cellular phone, the cross key 115 comprises a circular type center key 118 and a direction key 119. The center key 118 is not only an analog pointer 118 but also a confirm key 121. The direction key 119 comprises an "up" key 112, "down" key 123, "left" key 124, and "right" key 125.

Referring to (b) of FIG. 3, in the conventional cellular phone, the ten key 116 comprises a "call" key 126, "clear" key 127, "power" key 128, "1" key 131, "2" key 132, "3" key 133, "4" key 134, "5" key 135, "6" key 136, "7" key 137, "8" key 138, "9" key 139, "0" key 140, "*" key 141 and "4" key 142.

Referring to (c) of FIG. 3, in the conventional cellular phone, the menu key 117 comprises a "mail" key 143, "internet" key 144, "menu 1" key 145 and "menu 2" key 146.

(a) of FIG. 4 is a cross-sectional view of the cross key 114 of the conventional cellular phone (A-A cross-sectional view of the structure shown in (a) of FIG. 3). Referring to (a) of FIG. 4, the cross key 115 comprises a center key 118, direction key 119, permanent magnet 147, Hall device 148, elastomer 149, projections 150 and 151, hoard A 152, and board B 153.

The permanent magnet 147 is disposed within the center key 118. The Hall device 148 is disposed on the board A 152 and detects a position by the permanent magnet 147. The elastomer 149 connects elastically the center key 118 and the direction key 119 and plays the role of preventing dust and water. The projection on the elastomer 149 projects inside the housing A 111. The metal dome 151 is disposed on the board B 153 and performs a contact operation when deformed by the projection 150.

(b) of FIG. 4 is a cross-sectional view of the ten key 116 and menu key 117 of the conventional cellular phone (C-C cross-sectional view of the structure shown in (c) of FIG. 3). The elastomer 149 connects elastically the ten key 116 and menu key 117 and plays the role of preventing dust and water. The projection 150 on the elastomer 149 projects inside the housing A 111. The metal dome 151 is disposed on the board B 153 and performs a contact operation when deformed by the projection 150. It is to be noted that the elastomer 149 in (a) of FIG. 4 and the elastomer in (b) of FIG. 4 are connected to each other.

Referring to (a) of FIG. 5, in the conventional cellular phone, a pointer 154 displayed on the display screen 113 of the housing B 112 is controlled by the analog pointer 120 of the center key 118. Referring to (b) of FIG. 5, when the analog pointer 120 of the center key 118 is moved toward the upper left diagonal direction, the pointer 154 in the display screen 113 moves toward the upper left diagonal direction. Referring to (c) of FIG. 5, in the conventional cellular phone, when the "confirm" key of the center key 118 is entered, selection of an item on the display screen 113 is confirmed.

When the center key 118 is used as the analog pointer and moved to an arbitrary position, the pointer 154 on the display screen 113 of the housing B 112 is moved to an arbitrary position through detection of the relative position between the permanent magnet 147 inside the center key 118 and the Hall device 148.

When the center key 118 is used as the "confirm" key 121 and the metal dome 151 is deformed to perform a contact operation through pushing down of the center key 118, selection of an item on the display screen 113 of the housing B 112 is confirmed. Moreover, when the direction key 119 is pushed down and the metal dome 151 is deformed to perform a contact operation, a direction is selected on the display screen 113 of the housing B 112.

When the ten key 116 is pushed down (depressed) and the metal dome 151 is deformed to perform a contact operation, a number or character is input on the display screen 113 of the housing B 112. Moreover, when the menu key 117 is used, the menu key 117 is pushed down and the metal dome 151 is deformed to perform a contact operation and selection of a function on the display screen 113 of the housing B 112.

[Patent Document 1]
Japanese Patent Kokai Publication No. P2004-62447A

SUMMARY

It should be noted that the content disclosed in Patent Document 1 is hereby incorporated by reference in its entirety. The following analysis is given by the inventor. There are following problems in the conventional key structure.

A first problem is that it is difficult to perform an input operation and it takes a long time for an input operation. (a) of FIG. 6 illustrates an input operation of the "5" key of the ten key 116. (b) of FIG. 6 illustrates an input operation of the "confirm" key 121 of the center key 118. In a case of inputting, for example, a character for an e-mail etc., after a character is selected by the ten key 116 arranged in the lower side of the center key 118, on a surface of the housing A 111, the thumb is moved to the "confirm" key 121 of the center key 118 in order to confirm selection of the character. In this case, since it is necessary to move the thumb between the "5" key 135 and the "confirm" key 121, whose distance is L0, it is difficult to perform an input operation and it takes a long time for an input operation.

A second problem is that it is difficult to slide the analog pointer 120 of the center key 118. (a) of FIG. 7 illustrates a slide operation of the center key 118. When using the analog pointer 120 of the center key 118 as shown in (b) of FIG. 7, if the skin of the thumb is dry in winter for example, the friction between the thumb and the analog pointer 120 becomes small. When the friction between the center key 118 and the thumb performing a slide operation of the center key 118 becomes smaller in a case where the touching area between the center key 118 and the tip of the thumb is small, the thumb slips on the center key 118. Therefore, there is a case where a slide operation of the center key 118 is troublesome.

A third problem is that it is difficult to enter a key located at an end. Referring to (a) of FIG. 8, in a case where an input operation is performed with a forefinger hanging at a corner of the housing A 111, the thumb does not reach a key at an end sufficiently and it is difficult to enter the key. (b) of Referring to FIG. 8, in a case where an input operation is performed with a forefinger supporting the back of the housing A 111, the thumb does not reach a key at an end sufficiently and it is difficult to enter the key.

The following key structure comes to our minds as a key structure that solves these problems. FIG. 9 is a diagram illustrating an example of a simple solution. It is to be noted that (a) of FIG. 9 illustrates a conventional cellular phone.

(b) of FIG. 9 illustrates a cellular phone in which layout and direction of a cross key 115, ten key 116 and menu key 117 are changed. The cross key 115 is placed at the center of an upper plane of the housing A 111, and the menu key 117 is placed just outside the cross key 115. The key area (area where keys are arranged) of the cellular phone in (b) of FIG. 9 is smaller by (A1+A2) than that of the cellular phone in (a) of FIG. 9.

(c) of FIG. 9 illustrates a cellular phone in which ten key 116 is miniaturized and layout of a cross key 115, ten key 116 and menu key 117 is changed. The key area of the cellular phone in (c) of FIG. 9 is smaller by (A1+A2+A3+A4) than that of the cellular phone in (a) of FIG. 9.

According to the cellular phones in (b) and (c) of FIG. 9, the key area is narrowed, pushing a key at an end becomes easier, and input operation time is reduced by shortening the movement distance of the thumb between the cross key 115 and ten key 116. However, according to these cellular phones, operability of the slide operation of the center key 118 is not improved.

A fourth problem is that, if a long slide (slide over a long distance) of the analog pointer 120 is performed with pushing the "confirm" key of the center key 118, the "confirm" key 121 is released. FIG. 27 illustrates a long slide operation while pushing the center key 118. If the long slide of the analog pointer 120 is performed with pushing the "confirm" key of the center key 118, the projection 150 slides off the metal dome 151 and the "confirm" key 121 is released.

Therefore, there is a need in the art to reduce the key area (the area of a region where keys are arranged) of a composite switch comprising a plurality of switches to reduce the load of a key operation.

According to a first aspect of the present invention, there is provided a composite switch comprising: a first switch that operates by applying a first load to a first key; and a second switch that operates by applying a second load to a second key disposed on the first key.

According to a second aspect of the present invention, there is provided a composite switch comprising: a first switch that includes a first key pressed down by a first load; and a second switch that includes a second key pressed down by a second load, wherein a keytop of the second key is disposed on a keytop of the first key.

In a composite switch in a first mode, the first key may be elastically connected to a housing through an elastic member, movable in parallel and perpendicular directions to one of planes of the housing, on which the first key is disposed, and rotatable about an axis extending parallel to the plane; and the second key may be elastically connected to the first key through an elastic member and movable in a perpendicular direction to a pushing surface of the first key.

A composite switch in a second mode may comprise: a plurality of first flexible members each performs a contact operation in the first switch by changing its shape under the first load applied to the first key; and a plurality of second flexible members each performs a contact operation in the second switch by changing its shape under the second load applied to the second key.

In a composite switch in a third mode, the plurality of first flexible members may be disposed on a first board; and the plurality of second flexible members may be disposed on a second board that is parallel to the first board.

In a composite switch in a fourth mode, the second load may be less than the first load.

In a composite switch in a fifth mode, a projection for deforming one of the plurality of first flexible members, which one is located at a center of the plurality of the first flexible members, may have a longer height in the direction of the deformation than a projection for deforming the other flexible member located at a position other than the center.

In a composite switch in a sixth mode, the plurality of first flexible members may be dome-shaped; and one of the plurality of the first flexible members, which is located at a center of the plurality of the first flexible members, may be higher than the other.

In a composite switch in a seventh mode, the first key may include an analog pointer and a confirm key; and confirmation using the confirm key may be performed through deformation of one of the plurality of the first flexible members, which one is located at a center of the plurality of the first flexible members.

In a composite switch in a eighth mode, the first key may include a direction key; and selection of a direction using the direction key may be performed through deformation of one of the plurality of the first flexible members other than one located at a center of the plurality of the first flexible members.

In a composite switch in a ninth mode, the second key may include a ten key (numeric key).

In a composite switch in a tenth mode, the ten key may be located at a center of the first key; and the direction key may be arranged about the ten key.

A composite switch in a eleventh mode may further comprise a third key that is connected to the first key through an elastic member and located around the first key, wherein the third key may include a menu key; and selection of a menu using the menu key may be performed through deformation of one of the plurality of the first flexible members other than one located at a center of the plurality of the first flexible members.

In a composite switch in a twelfth mode, the plurality of the first flexible members and/or the plurality of the second flexible members may be a metal dome.

In a composite switch in a thirteenth mode, one of the plurality of the first flexible members, which one is located at a center of the plurality of the first flexible members, may be a metal dome attached with a projection on its top.

In a composite switch in a fourteenth mode, the metal dome attached with a projection may be disposed on a third board that faces the first board, directing the projection toward the first board.

A composite switch in a fifteenth mode may further comprise a stopper that prevents the first key from being pressed down the second key is pressed down to perform a contact operation in the second switch.

In composite switch in a sixteenth mode, the stopper may be disposed on the bottom of the second key and may touch the first board if the second key is pressed down to perform a contact operation in the second switch.

In a composite switch in a seventeenth mode, the stopper may be disposed on the first board and may touch the second key if the second key is pressed down to perform a contact operation in the second switch.

An electronic device in an eighteenth mode may comprise the above composite switch.

The present invention provides the following advantage, but not restricted thereto. According to a key assembly of the present invention, it is possible to reduce the key area of a composite switch comprising a plurality of switches and reduce the load of a key operation. Since the second key for the second switch is disposed on the first key for the first switch in the present invention, it is possible to reduce the key area. Furthermore, reduction of the key area reduces the load of a key operation. By setting the load for a switch operation of the first key at a value different from that for a switch operation of the second key, these keys can be distinguished.

Explanations of symbols are given in the following description.

PREFERRED MODES

First Exemplary Embodiment

Figure 16:
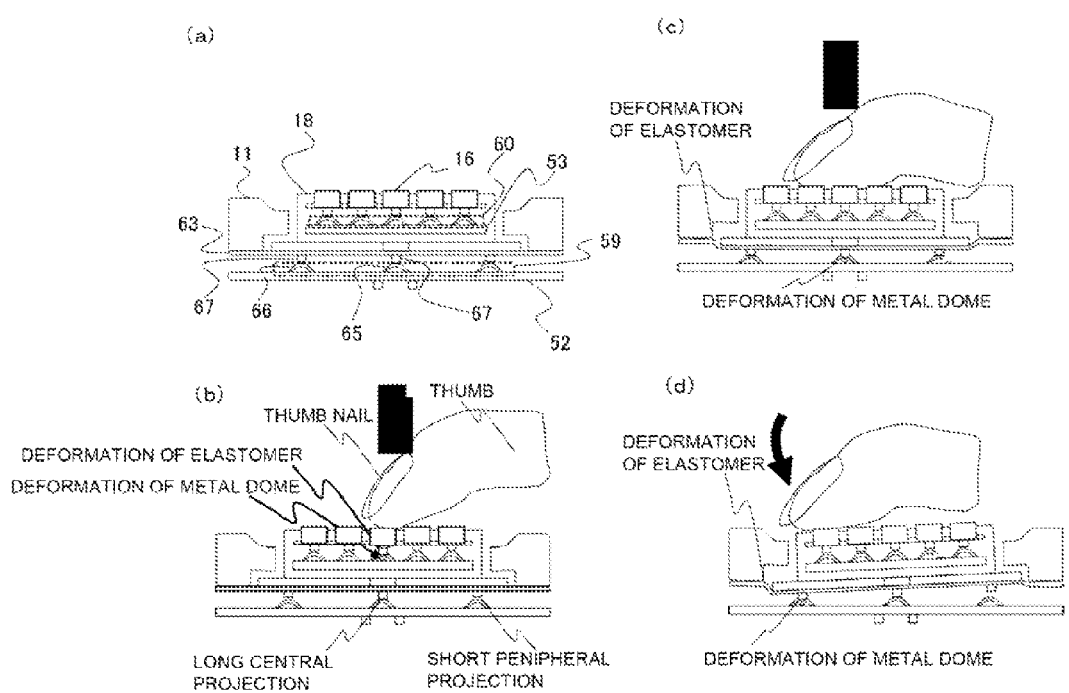
FIG. 16 is a diagram illustrating a structure of a composite switch according to a first example.

A composite switch (or switch assembly) according to a first exemplary embodiment is described with reference to the drawings. FIG. 16 illustrates a cross-sectional view of the composite switch according to the present exemplary embodiment.

Referring to FIG. 16, the composite switch comprises a first switch and a second switch. The first switch operates by applying a first load to a first key (center key 18 in FIG. 16 for example). The second switch operates by applying a second load to a second key (ten key 16 in FIG. 16 for example) disposed on the first key.

The first key (center key 18 in FIG. 16 for example) may be elastically connected to a housing (housing A 11 in FIG. 16 for example) through an elastic member (elastomer A 63 in FIG. 16 for example), movable in parallel and perpendicular directions to one of planes of the housing, on which the first key is disposed, and rotatable about an axis extending parallel to the plane. Moreover, the second key (ten key 16 in FIG. 16 for example) may be elastically connected to the first key through an elastic member and movable in a perpendicular direction to a pushing surface of surface planes of the first key.

The composite switch may comprise one or more first flexible members (metal dome array A 59 in FIG. 16 for example) and one or more second flexible members (metal dome array B 60 in FIG. 16 for example). Each of the first flexible members performs a contact operation by changing its shape under the first load applied to the first key. Each of the second flexible members performs a contact operation by changing its shape under the second load applied to the second key.

The first flexible members are preferably disposed on a first board (board A 52 in FIG. 16 for example). The second flexible member are preferably disposed on a second board (board B 53 in FIG. 16 for example) that is parallel to the first board.

The second load may be also less than the first load.

A projection (central projection 67 in FIG. 16 for example) for deforming one of the first flexible assembly, which is located at a center of the first flexible assembly, is preferably longer in the direction of the deformation than a projection (peripheral projection 68 in FIG. 16 for example) for deforming the other. In this way, when a contact operation is performed by deforming the flexible assembly at a center, it is possible to prevent the flexible members located other than the center from deformation.

It is preferable that the first flexible members are preferably dome-shaped and one of the first flexible members (central metal dome 65 in FIG. 16 for example), which one is located at a center of the flexible members, is higher than the other (peripheral metal dome 66 in FIG. 16 for example). In this way, when a contact operation is performed by deforming the flexible assembly at a center, it is possible to prevent the flexible members located other than the center from deformation.

The first key may include an analog pointer and a confirm key, and confirmation using the confirm key may be performed though deformation of one (central metal dome 65 in FIG. 16 for example) of the first flexible members, which one is located at a center of the first flexible members.

Figure 10:
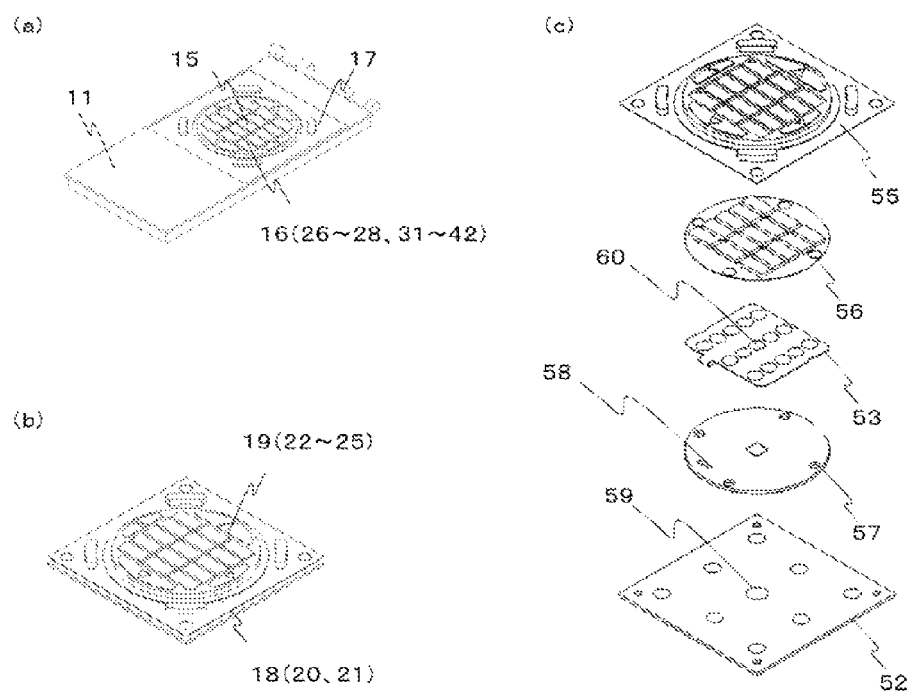
FIG. 10 is a diagram illustrating a structure of a composite switch according to a first example.

The first key may include a direction key (direction key 19 in (b) of FIG. 10 for example), and selection of direction may be performed through deformation of one (peripheral metal dome 66 in FIG. 16 for example) of the flexible members other than ones located at a center of the first flexible members.

The second key may comprise a numeric key called in Japan as "ten key" (ten key 16 in (b) of FIG. 10 for example).

Figure 1:
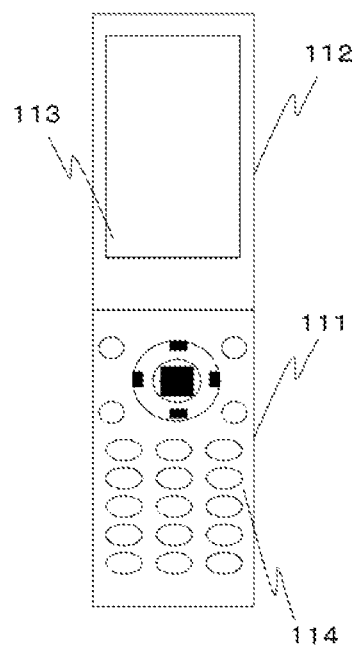
FIG. 1 is a diagram illustrating a structure of a conventional cellular phone.
Figure 2:
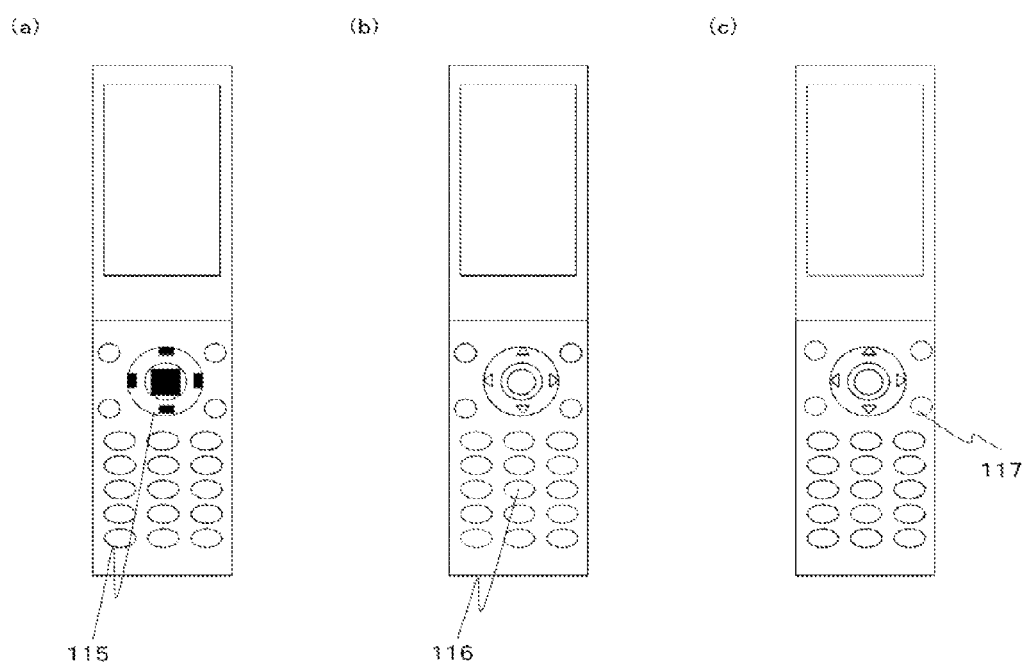
FIG. 2 is a diagram illustrating a structure of a conventional cellular phone.
Figure 3:
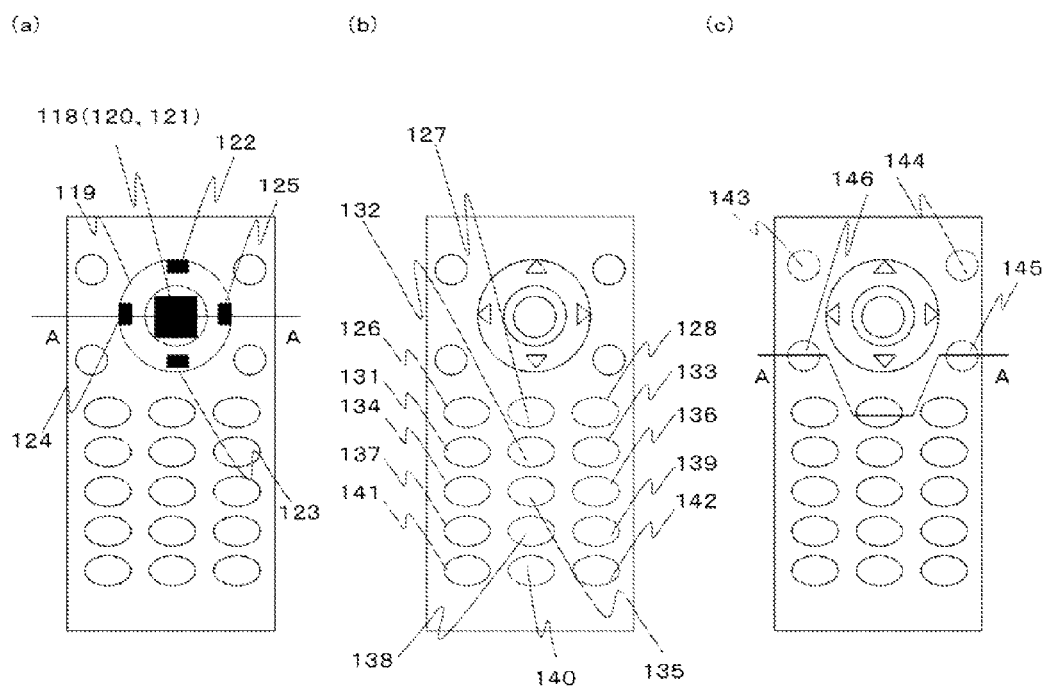
FIG. 3 is a diagram illustrating a structure of a conventional cellular phone.
Figure 4:
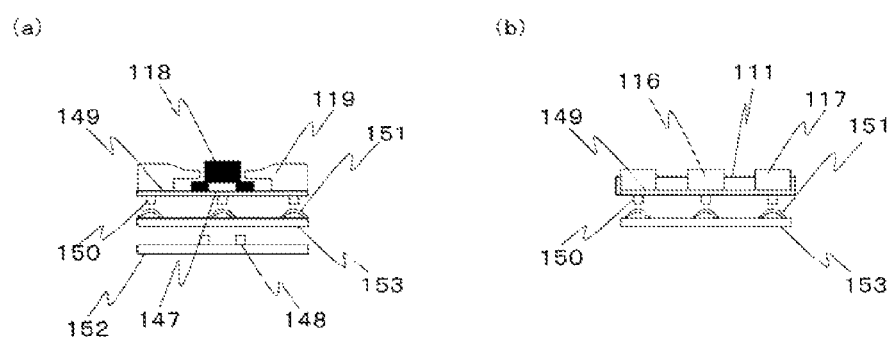
FIG. 4 is a diagram illustrating a cross-sectional view of a conventional cellular phone.
Figure 5:
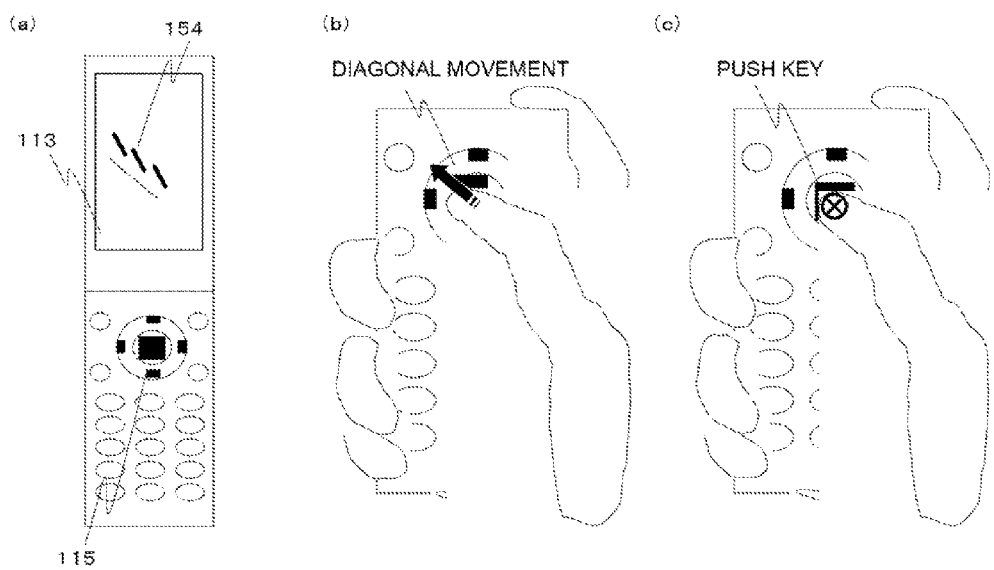
FIG. 5 is a diagram illustrating an operation of a center key of a conventional cellular phone.
Figure 6:
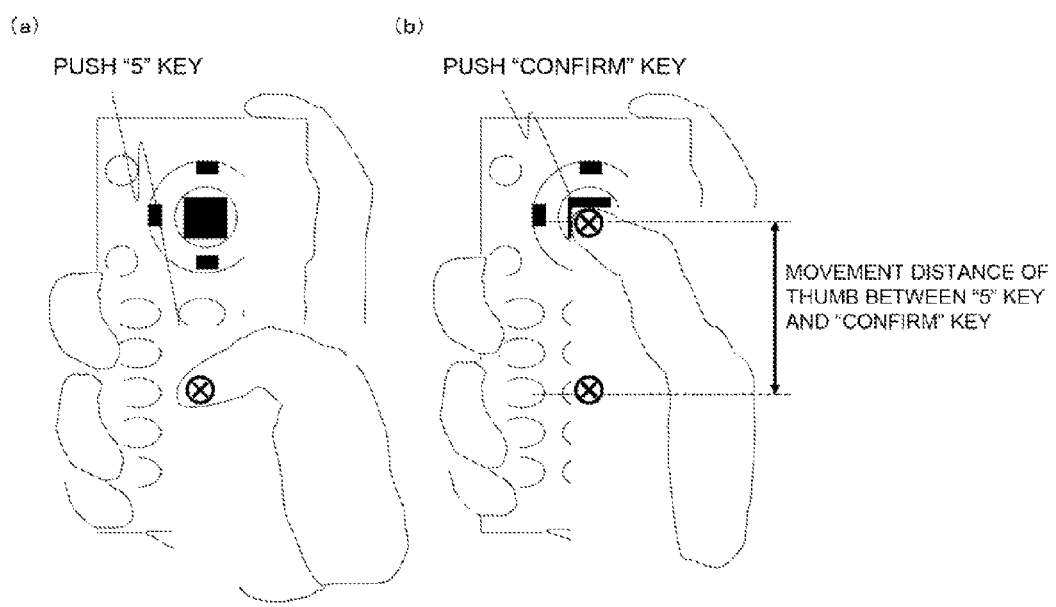
FIG. 6 is a diagram illustrating an operation of a ten key and center key of a conventional cellular phone.
Figure 7:
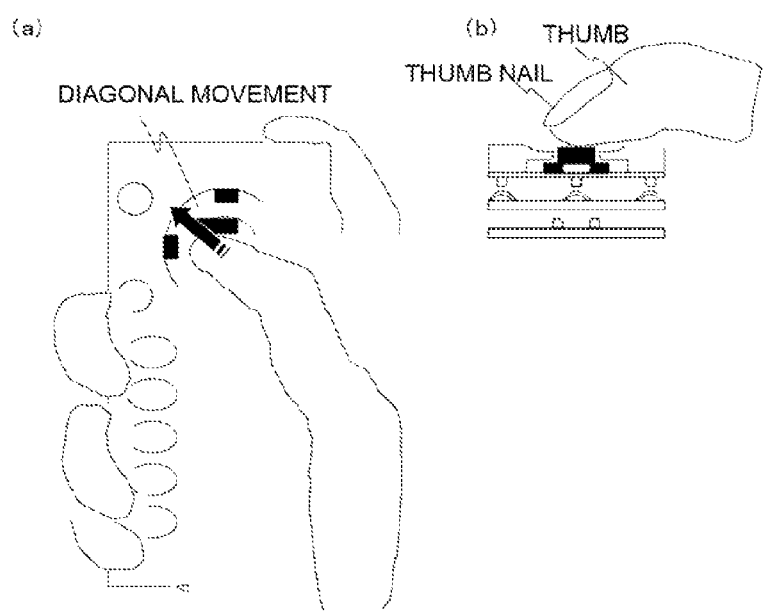
FIG. 7 is a diagram illustrating a sliding operation of an analog pointer on a center key of a conventional cellular phone.
Figure 8:
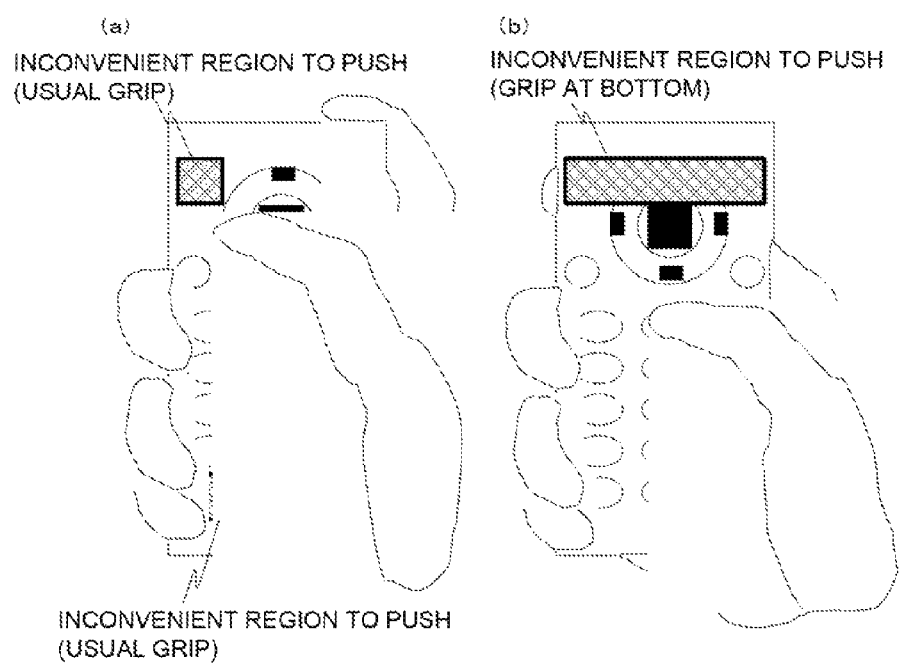
FIG. 8 is d diagram illustrating an operation of a key located at an end of a conventional cellular phone.
Figure 9:
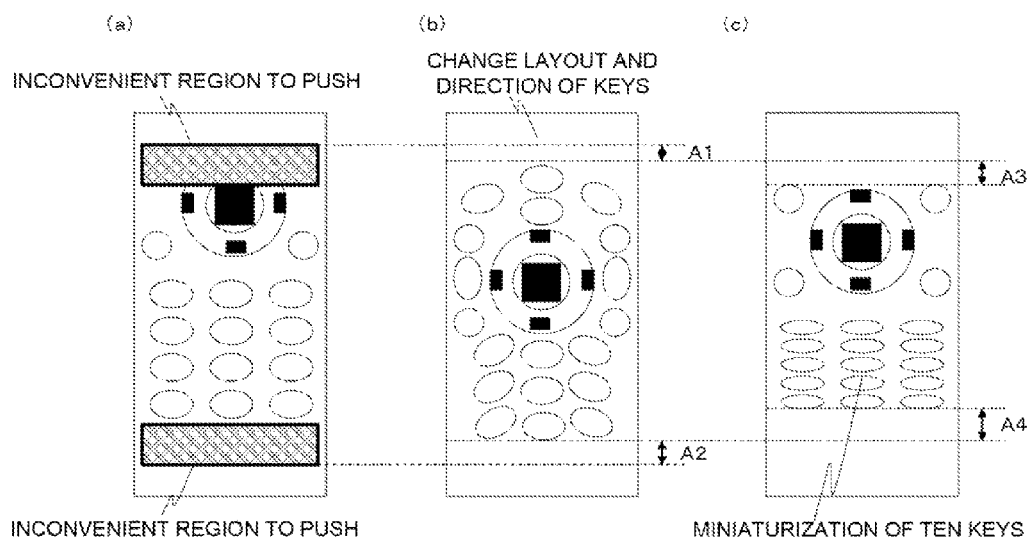
FIG. 9 is a diagram illustrating a simple structure for avoiding the problem in a conventional cellular phone.

The ten key (ten key 16 in (b) of FIG. 10 for example) may be located at a center of the first key (center key 18 in (b) of FIG. 10 for example), and the direction key (direction key 19 in (b) of FIG. 10 for example) may be arranged around the ten key. In this way, in a case where an operation of the direction key follows an operation of the ten key (or in the opposite case), movement distance of a finger can be made shorter than that in the conventional cellular phone (FIG. 3 for example).

The first flexible members and/or second flexible members may be metal domes (metal dome array A 59, metal dome array B 60 in FIG. 16 for example).

Figure 29:
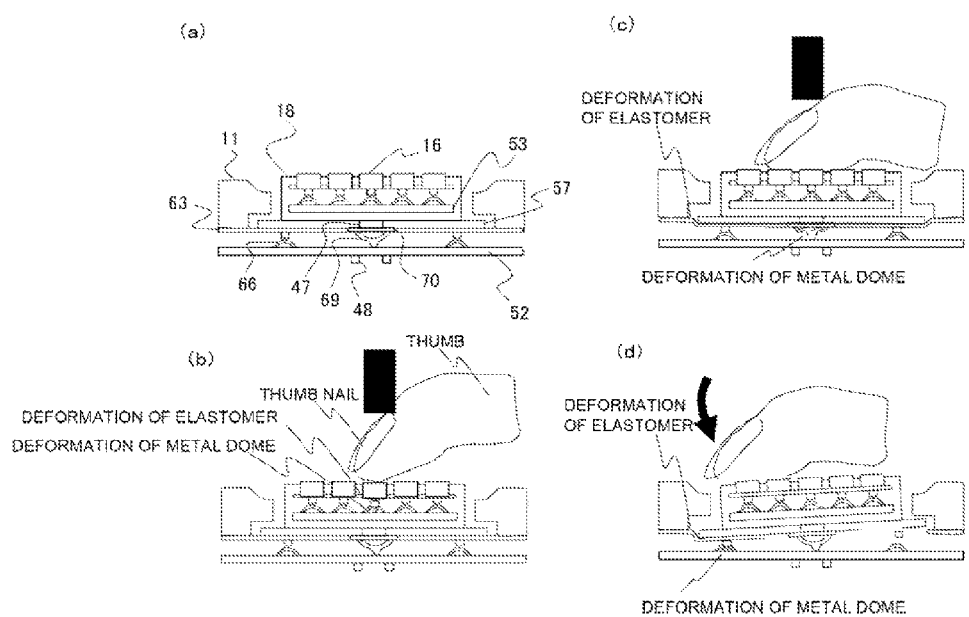
FIG. 29 is a diagram illustrating a structure of a composite switch according to a fifth example.

Referring to FIG. 29, one of the first flexible members, which is located at a center of the first flexible members, may be a metal dome attached with a projection on its top (metal dome with a projection 69 in FIG. 29 for example).

Moreover, the metal dome attached with a projection (a metal dome with a projection 69 in FIG. 29 for example) may be disposed on a third board (board C 70 in FIG. 29 for example) that faces the first board, directing the projection toward the first board (board A 52 in FIG. 29 for example).

Second Exemplary Embodiment

A composite switch according to a second exemplary embodiment is described with reference to the drawing. FIG. 10 is a diagram illustrating the composite switch according to the second exemplary embodiment.

Referring to FIG. 10, a center key 18 of a cross key 15 is both an analog pointer 20 and a "confirm" key 21. A direction key 19 of the cross key 15 and ten key 16 are arranged inside the center key 18. The "confirm" key 21 of the cross key 15 and a "5" key of the ten key 16 are located at an equivalent position on a plane ("key plane") of the housing A 11, on which keys are arranged and arranged to form a step in the direction of the thickness of the housing A 11 (perpendicular direction of to the key plane).

By setting a push load for the metal dome of the "5" key (load at which the metal dome buckles) at a value less than a push load for the metal dome for the "confirm" key 21, one can push either of these keys. The switch structure is not limited to the metal dome. Other switch structure such as a conductive rubber dome may be employed. A contact scheme of the key may be a capacitive scheme (capacitive sensor for example) or a piezoelectric scheme (pressure sensitive conductive rubber sheet for example).

Since the center of the cross key 15 and the center of the ten key 16 are located at an equivalent position, it is possible to shorten the movement distance of a finger between the ten key 16 and "confirm" key 21 and to perform a rapid input operation of a character for an e-mail etc. Moreover, since the size of the center key 18 can be made larger compared with that of the conventional center key, it is possible to perform a slide operation with the entire thick of a thumb. Therefore, even when the skin of the thumb is dry, the friction between the center key 18 and the thumb is maintained and it is possible to perform a slide operation of the center key 18 successfully. Moreover, the narrowed key area makes it easier to reach a key located at an end.

First Example

A composite switch according a first example and a cellular phone with the composite switch are described with reference to the drawings.

FIGS. 10 to 17 are drawings illustrating a structure of a composite switch according to a first example and a cellular phone with the composite switch.

(a) of FIG. 10 is an outer perspective view of the cellular phone according to the present example. A cross key 15 is located at a upper side of the center of the housing A 11. A ten key 16 is located within a circular type center key 18 of the cross key 15. The center of the cross key 15 and the center of the ten key 16 are located at an equivalent position on the key arrangement surface of the housing A 11.

A menu key 17 is located just outside the cross key 15 on the key arrangement surface of the housing A 11. The cross key 15 comprises a large sized center key 18 that includes the ten key 16.

The center key 18 comprises an analog pointer 20, "confirm" key 21, direction key 19, and ten key 16.

The direction key 19 comprises an "up" key 22, "down" key 23, "left" key 24, and "right" key 25.

The ten key 16 comprises a "call" key 26, "clear" key 27, "power" key 28, "1" key, "2" key, "3" key, "4" key, "5" key, "6" key, "7" key, "8" key, "9" key, "0" key, "*" key 141 and "#" key.

Figure 12:
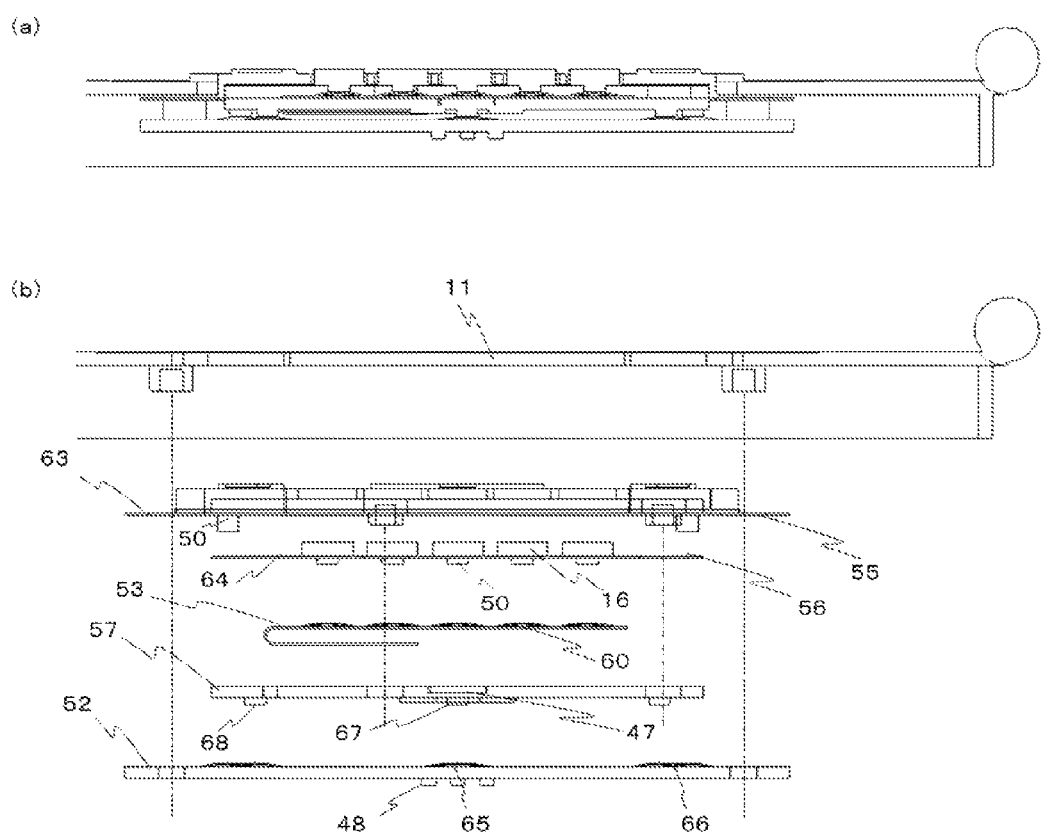
FIG. 12 is a diagram illustrating a structure of a composite switch according to a first example.

The menu key 17 comprises a "mail" key, "interne" key, "menu 1" key and "menu 2" key. Referring to FIG. 12, the key structure comprises a top key sheet 55, second key sheet 56, board B 53, intermediate base 57 and board A 52 one on top of another in this order.

The top key sheet 55 comprises: a center key 18; a direction key 19 arranged at an edge of the center key 18; an elastomer A 63 that connects elastically the center key 18 and the menu key 17 and plays the role of preventing dust and water; and a projection 50 that projects from the elastomer A 63 toward the inside of the housing A 11.

The second key sheet 56 comprises: a ten key 16; an elastomer B 64 that connects elastically the ten key 16 and plays the role of preventing dust and water; and a projection 50 that projects from the elastomer B 64 toward the inside of the housing A 11.

On the board 53, metal domes are arranged that perform a contact operation when deformed by the projection 50. These metal domes compose a metal dome array B 60 ((c) of FIG. 10).

The intermediate base 57 comprises: a permanent magnet 47, a central projection 67 that projects from the center of the intermediate base 57 toward the inside of the housing A 11; peripheral projections 68 that project from the peripheral region of the intermediate base 57 toward the inside of the housing A 11.

The board A 52 comprises: a central metal dome 65 that performs a contact operation when deformed by the central projection 67; peripheral metal domes 66 that performs a contact operation when deformed by the peripheral projections 68; and a Hall device 48 that makes it possible to detect a position by the permanent magnet 47. The central metal dome 65 and the peripheral metal domes compose a metal dome array A 59 ((c) of FIG. 10).

It is to be noted that the top key sheet 55 and the board A 52 are fixed to a boss A 61 of the housing A 11 with a screw. Since the top key sheet 55, along with the board A 52, is fixed to the boss A 61 of the housing A 11 with a screw, the center key 18 and the housing A 11 are connected elastically through the elastomer A 63. Therefore, the elastomer A 63 plays the role of preventing dust and water intrusion between the center key 18 and the housing A 11.

It is preferable that the center key 18 can slide in any direction parallel to the key arrangement surface of the housing A 11, move up and down in a direction perpendicular to the key arrangement surface and rotate about an axis extending parallel to the key arrangement surface.

The second key sheet 56, board B 53 and intermediate base 57 are fixed to a boss B 62 of the top key sheet 55 with a screw. The second key sheet 56, along with the board B 53 and intermediate base 57, is fixed to the boss B 62 of the top key sheet 55 with a screw, the center key 18 and ten key 16 are connected elastically through the elastomer B 64. Therefore, the elastomer B 64 plays the role of preventing dust and water intrusion between the center key 18 and ten key 16.

The ten key 16 move up and down in a direction perpendicular to the key plane of the center key 18.

The center of the metal dome array B 60 arranged inside the center key 18 and the center of the metal dome array A 59 arranged under the center key 18 are located at an equivalent position in the key arrangement surface of the housing A 11. The metal dome array B 60 and metal dome array A 59 are arranged to form a step in the direction of the thickness of the housing A 11.

A push load for the metal dome B arranged inside the center key 18 is preferably smaller than a push load for the metal dome A arranged under the center key 18.

The central one within the projections for deforming a metal dome A arranged under the center key 18 is preferably shorter in the direction of the deformation than the peripheral projections.

Moreover, the central one within the metal domes A arranged under the center key 18 is preferably higher in the direction of the deformation than the peripheral metal domes.

An operation of the composite switch (or key assembly) according to the present invention when a key is operated is described with reference to FIGS. 12, and 14 to 16.

Figure 14:
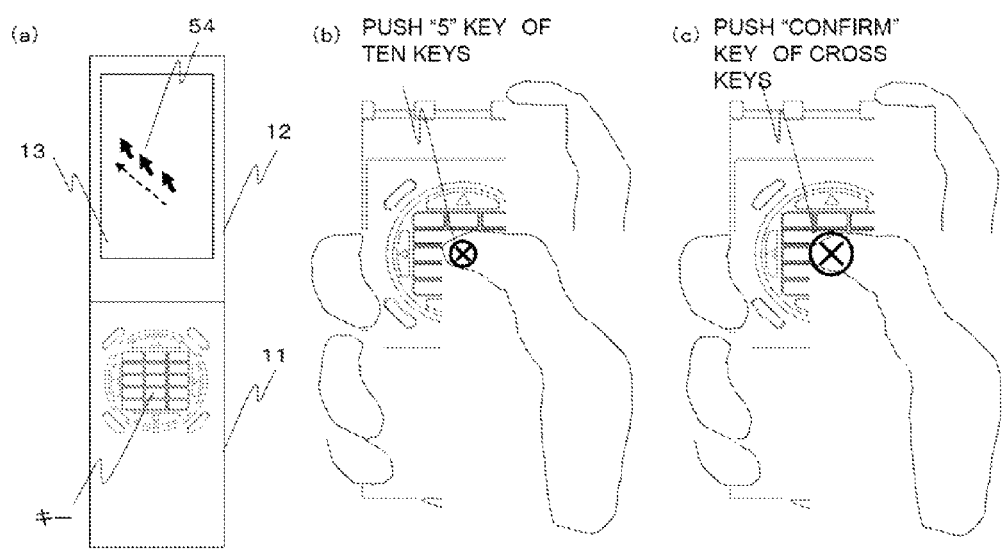
FIG. 14 is a diagram illustrating a structure of a composite switch according to a first example.

(b) of FIG. 12 is an exploded cross sectional view of the cellular phone according to the present example. (a) of FIG. 14 is a front view of the cellular phone according to the present example. (a) of FIG. 16 is a cross sectional view of the center key 18 of the cellular phone according to the present example.

(b) of FIG. 14 illustrate a case in which a "5" key 35 of the ten key 16 is pushed. Note that it is assumed that a key at the center of the ten key 116 is the "5" key in (b) of FIG. 14.

Referring to (b) of FIG. 12 and (b) of FIG. 16, if the "5" key 35 of the ten key 16 is pushed down in order to use the "5" key 35 of the ten key 16, a metal dome on the board B 53 is deformed by the projection 50 on the second key sheet 56 to perform a contact operation. In this way, on a display screen 13 of the housing B 12, a number or character corresponding to the "5" key 35 is input.

Figure 11:
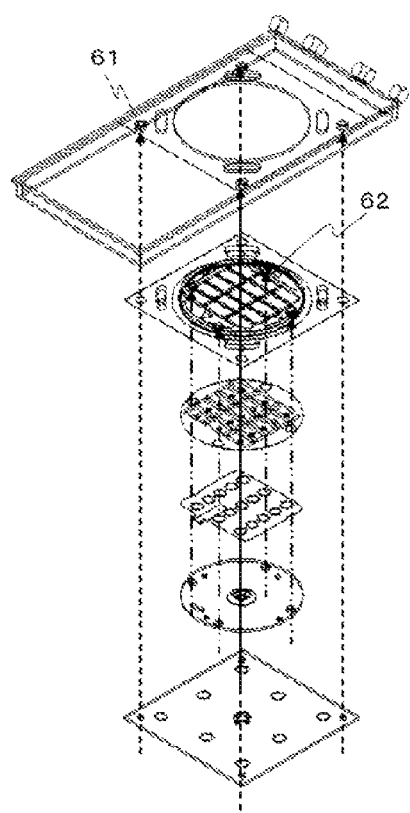
FIG. 11 is a diagram illustrating a structure of a composite switch according to a first example.
Figure 11:
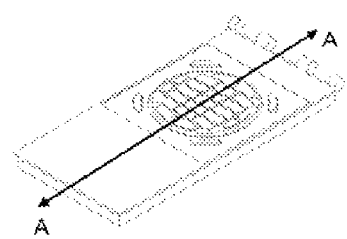

Referring to (a) of FIG. 11, since the second key sheet 56, along with the board B 53 and intermediate base 57, is fixed to the boss B 62 of the top key sheet 55 with a screw, the center key 18 and ten key 16 are connected elastically thorough the elastomer B 64. Therefore, the ten key 16 moves in a direction perpendicular to the center key 18.

Moreover, it is possible to push the "5" key 35 of the ten key 16 with the tip of a thumb or the thumb nail.

Since a push load for a metal dome on the board B 53 is less than a push load for a metal dome on the board A 52, it is possible to push down the metal dome on the board B 53 without pushing down the metal dome on the board A 52 if the push load is small.

The board B 53 may be a flexible board comprising a polyimide. The U-shaped flexible board is connected electrically to the board A 52 thorough a long hole 58 for a flexible board to path through.

(c) of FIG. 14 is a drawing illustrating a case in which a "confirm" key 21 of the center key 18 is pushed. The center key 18 in (c) of FIG. 14 is the "confirm" key 21.

Referring to (b) of FIG. 12 and (c) of FIG. 16, when the "confirm" key 21 is used, the center key 18 is pushed down and the central metal dome 65 on the board A 52 is deformed by the central projection 67 on the intermediate base 57 to perform a contact operation and confirm selection of an item on the display screen 13 of the housing B 12.

Since the top key sheet 55, along with the board A 52, is fixed to the boss A 61 of the housing A 11 with a screw, the center key 18 and the housing A 11 are connected elastically through the elastomer A 63. Therefore, the center key 18 moves in a perpendicular direction to the housing A 11.

It is possible to push the "confirm" key 21 of the center key 18 with the thick of a thumb. Since a push load is applied to the entire frame of the ten key 16 on the center key 18 when pushed by the thick of a thumb, the "5" key 35 of the ten key 16 is not pushed down.

Referring to (c) of FIG. 16, although peripheral projections located in the peripheral part of the projections 50 on the intermediate base 57 (peripheral projections 68) and metal domes located in the peripheral part of the metal domes on the board A (peripheral metal domes 66) contact each other, the peripheral metal domes 66 are not deformed because the central projection 67 is longer than the peripheral projections 68.

(d) of FIG. 16 illustrates a case in which a direction key 19 of the center key 18 is pushed. In this case, the center key 18 in (d) of FIG. 16 correspond to a direction key 19.

When the direction key 19 is used, the direction key 19 is pushed down and a peripheral metal dome 66 on the board A 52 is deformed by a peripheral projection 68 on the intermediate base 57 to perform a contact operation and selection of a direction on the display screen 13 of the housing B 12.

Since the top key sheet 55, along with the board A 52, is connected to the boss A 61 of the housing A 11 with a screw, the center key 18 and the housing A 11 are connected elastically through the elastomer A 63. Therefore, the center key 18 rotates about a horizontal axis of the housing A 11 (axis parallel to a plane of the housing A 11, on which keys are arranged).

It is possible to push the direction key 19 of the center key 18 by the thick of a thumb. Since a push load is applied to the entire frame of the ten key 16 on the center key 18 when pushed by the thick of a thumb, the ten key 16 are not pushed down. Moreover, when the direction key 19 is operated, a contact point between the central projection 67 on the intermediate base 57 and the central metal dome 65 on the board A 52 serves as a fulcrum for the center key 18. Since the center key 18 rotated around the contact point as the fulcrum, the central metal dome 65 is not deformed.

Figure 15:
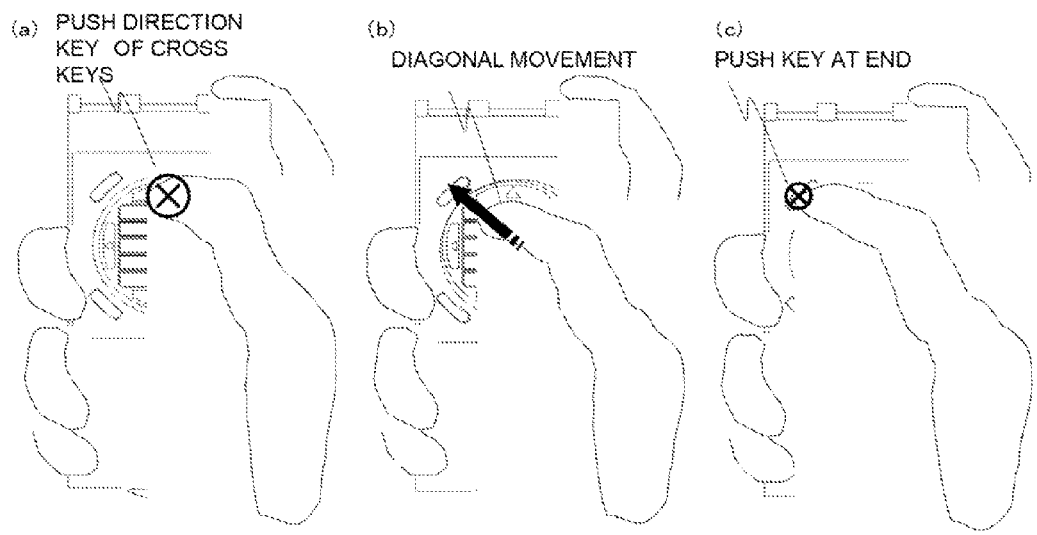
FIG. 15 is a diagram illustrating a structure of a composite switch according to a first example.

(b) of FIG. 15 illustrates a slide operation of the center key 18. In this case, the center key 18 in (b) of FIG. 15 corresponds to an analog pointer 20.

When using the center key 18 as the analog pointer 20, if the center key 18 is slid to an arbitrary position on a plane of the housing A 11, the pointer 54 on the display screen 13 of the housing B 12 is moved to an arbitrary position through detection of the relative position between a permanent magnet 47 inside the center key 18 and a Hall device 48.

Since the top key sheet 55, along with the board A 52, is fixed to the boss A 61 of the housing A 11 with a screw, the center key 18 and the housing A 11 are connected elastically thorough the elastomer A 63. Therefore, it is possible to slide the center key 18 in an arbitrary direction parallel to the housing A 11. The top key sheet 55 does not move relatively to the housing A 11. Moreover, since the central projection 67 on the intermediate base 57 and the central metal dome 56 on the board A 52 contacts each other, the center key 18 is not pushed down inside the housing A 11. Therefore, it is possible to perform a smooth slide operation.

An operation of the menu key 17 located at an end of the cellular phone is described. (c) of FIG. 15 illustrates a case in which a key located at an end is pushed. The key located at an end in (c) of FIG. 15 is a menu key 17.

When the menu key 17 is used, the menu key 17 is pushed down and a metal dome on the board A 52 is pushed down by a projection on the top key sheet 55 to perform a contact operation and selection of a function on the display screen 13 of the housing B 12.

Meritorious effects of the composite switch according to the present example are described in the following.

(b) and (c) of FIG. 14 are drawings illustrating how input operation time is reduced in a cellular phone with a composite switch according to the present example. Referring to (b) and (c) of FIG. 14, ten key 16 are located within a center key 18. Moreover, the center of a cross key 15 and the center of the ten key 16 are located at an equivalent position on a plane of the housing A 11.

Therefore, when a character for an e-mail etc. is input, the movement distance (displacement) of the thumb between the ten key 16 and the "confirm" key 21 is shortened to realize a rapid input operation.

Figure 17:
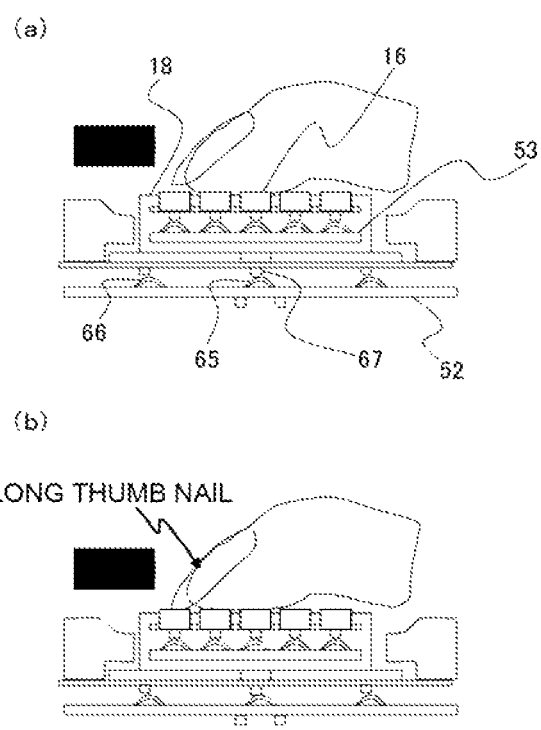
FIG. 17 is a diagram illustrating a structure of a composite switch according to a first example.

(b) of FIG. 15 and (a) of FIG. 17 are drawings illustrating how slide operability of the center key 18 is enhanced in a cellular phone with a composite switch according to the present example. Referring to (b) of FIG. 15 and (a) of FIG. 17, since the center key 18 is sufficiently large, it is possible to perform a slide operation with the thick of a thumb. Therefore, even when the skin of the thumb is dry, the friction between the center key 18 and the thumb is sufficiently large and it is possible to perform a slide operation of the center key 18 successfully.

(b) of FIG. 15 and (b) of FIG. 17 are drawings illustrating how slide operability of the center key 18 is enhanced in a cellular phone with a composite switch according to the present example.

Referring to (b) of FIG. 15 and (b) of FIG. 17, the center key 18 in the cellular phone according to the present example is sufficiently large compared with the conventional center key. Therefore, even when the thumb nail is long, the slide operation can be performed not with the thumb nail but with the thick of the thumb and it is possible to perform a slide operation of the center key 18 successfully.

(b) of FIG. 15 and (b) of FIG. 17 are drawings illustrating how slide operability of the center key is enhanced in a cellular phone with a composite switch according to the present example.

Referring to (b) of FIG. 15 and (b) of FIG. 17, the center key 18 in the cellular phone according to the present example is sufficiently large. Therefore, even when the thumb nail is long, the slide operation can be performed with the thick of the thumb without touching the housing A 11 outside the center key 18 and it is possible to perform the slide operation successfully.

It is to be noted that a switch operation may be caused by combination of the slide operation shown in (a) of FIG. 17 and the rotation operation shown in (d) of FIG. 16.

(c) of FIG. 15 is a drawing illustrating how easy it is to push a key located at an end of a cellular phone with a composite switch according to the present example.

Referring to (c) of FIG. 15, in the cellular phone according to the present invention, the ten key 16 are arranged inside the center key 18 of the cross key 15 and the center of the cross key 15 and the center of the ten key 16 are arranged at an equivalent position in a plane of the housing A 11. The menu key 17 is arranged just outside the cross key 15 on the plane of the housing A 11. Therefore, the key area is narrowed as a whole. In this case, it is easy to push the menu key 17 at an end because the thumb sufficiently reaches the key.

Figure 13:
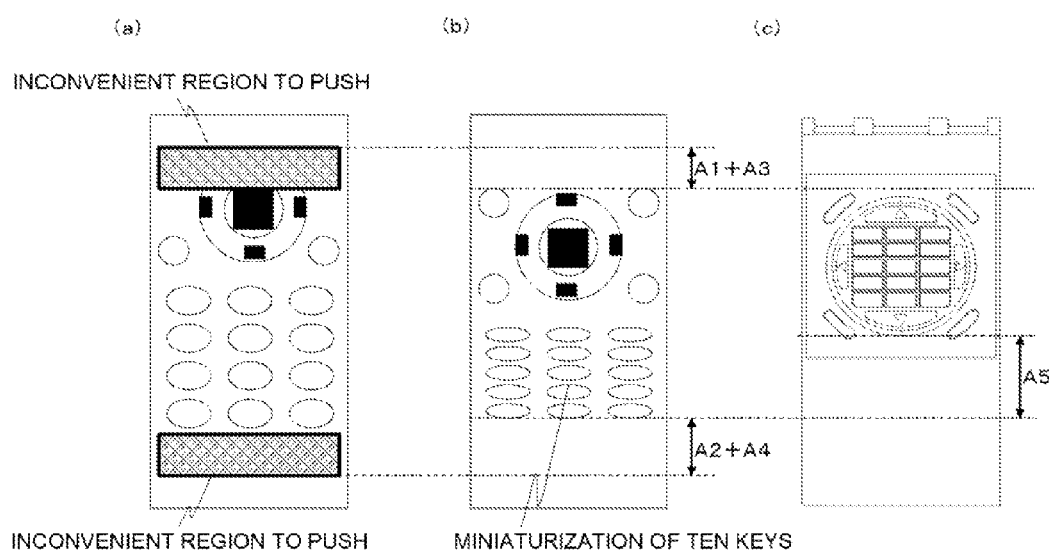
FIG. 13 is a diagram illustrating a structure of a composite switch according to a first example.

FIG. 13 is a drawing illustrating how key area is narrowed in the cellular phone according to the present example.

(a) of FIG. 13 illustrates a conventional cellular phone. (b) of FIG. 13 illustrates a cellular phone in which a ten key 16 is miniaturized and layout of a cross key 15, ten key 16 and menu key 17 is changed. (c) of FIG. 13 illustrates a cellular phone according to the present example.

Referring to (c) of FIG. 13, a ten key 16 of the cellular phone according to the present example are located within the center key 18 of the cross key and the center of the cross key 15 and the center of the ten key 16 are located at an equivalent position on a plane (plane on which keys are arranged) of the housing A 11. The menu key 17 is arranged just outside the cross key 15 on the plane of the housing A 11.

Therefore, the key area of the cellular phone according to the present example shown in (c) of FIG. 13 is narrower by (A1+A2+A3+A4+A5) than that of the conventional cellular phone. Moreover, the key area of the cellular phone shown in (c) of FIG. 13 is narrower than that in the cellular phone shown in (b) of FIG. 13.

Effects provided by the composite switch according to the present example and a cellular phone with the same are explained further in the following.

As a first effect, it is possible to reduce the key area. The reason is that the center of the cross key 15 and the center of the ten key 16 are located at an equivalent position.

As a second effect, it is possible to accelerate the input operation. The reason is that, when a character for an e-mail etc. is input, the movement distance of a thumb between the ten key 16 and "confirm" key 21 is short because the center of the cross key 15 and the center of the ten key 16 are located at an equivalent position.

As a third effect, even when the skin of a thumb is dry, it is possible to slide the center key 18. The center key 18 is large enough to perform a slide operation with the thick of the thumb. In this case, even when the skin of the thumb is dry, the friction between the center key 18 and the thumb is kept high enough.

As a fourth effect, even when the nail of a thumb is long, it is possible to perform a slide operation of the center key 18 successfully. The reason is that the slide operation can be performed not with the nail of a thumb but with the thick of the thumb because the center key 18 is large enough.

As a fifth effect, even when the nail of a thumb is long, it is possible to perform a slide operation of the center key 18 successfully. The reason is that the slide operation can be performed with the thick of the thumb without touching the housing A 11 outside the center key 18 because the center key 18 is large enough.

As a sixth effect, it is easy to push a key at an end of the housing because the finger sufficiently reaches the key. The reason is that the key area is narrowed because the center of the cross key 15 and the center of the ten key are at an equivalent position.

Second Example

Figure 18:
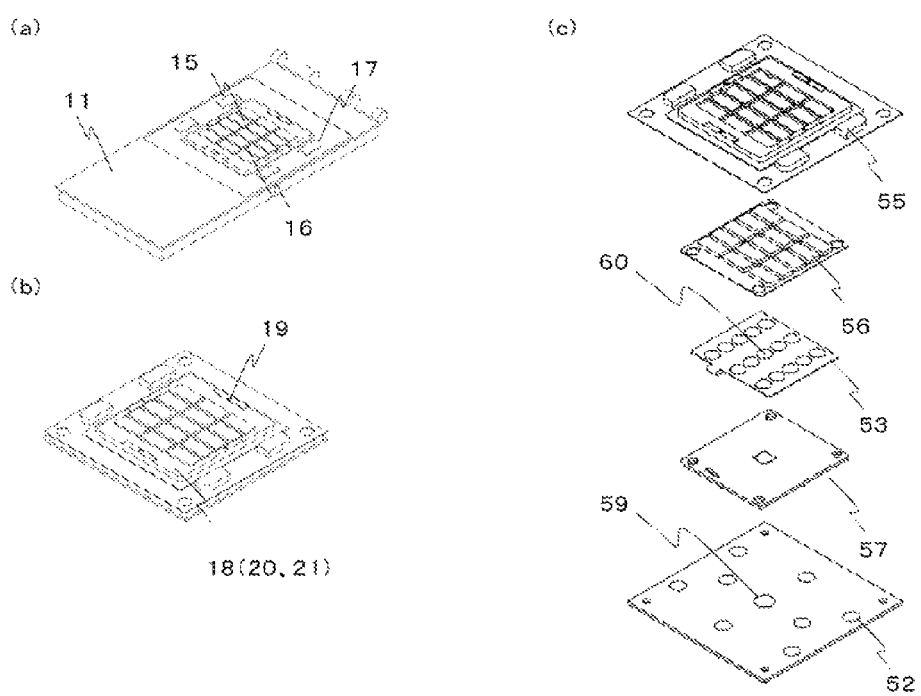
FIG. 18 is a diagram illustrating a structure of a composite switch according to a second example.
Figure 19:
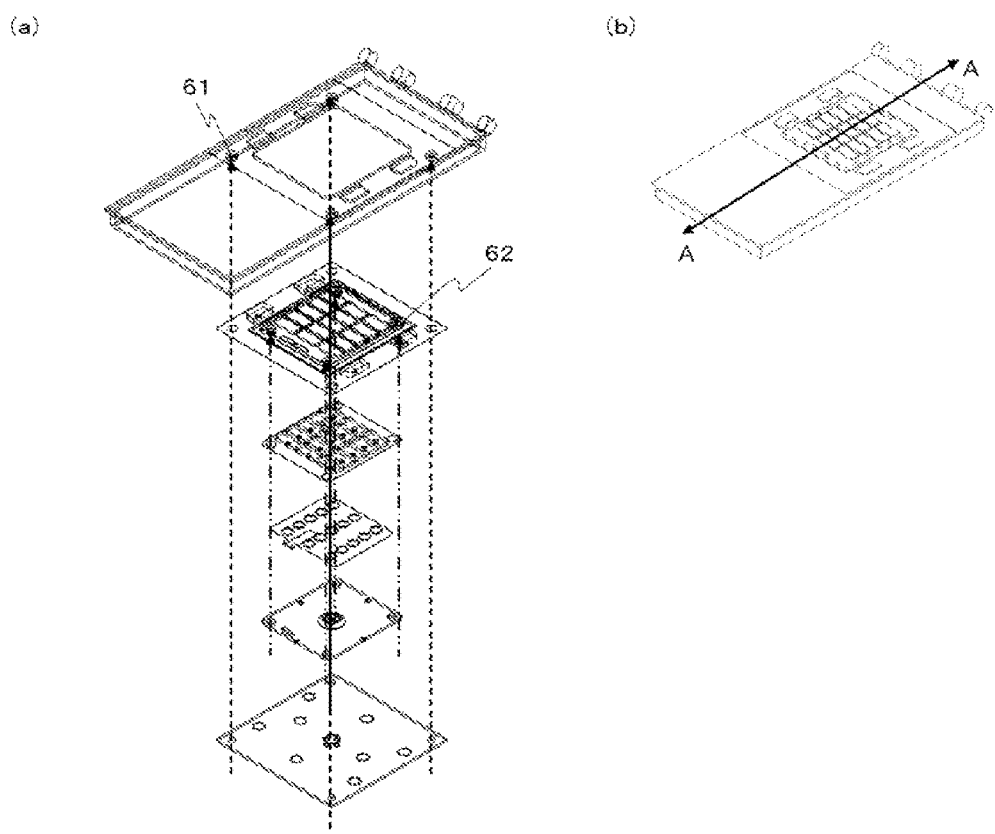
FIG. 19 is a diagram illustrating a structure of a composite switch according to a second example.
Figure 20:
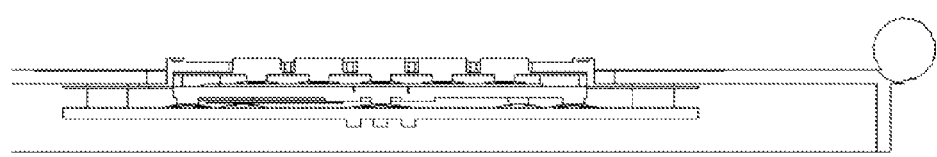
FIG. 20 is a diagram illustrating a structure of a composite switch according to a second example.
Figure 20:
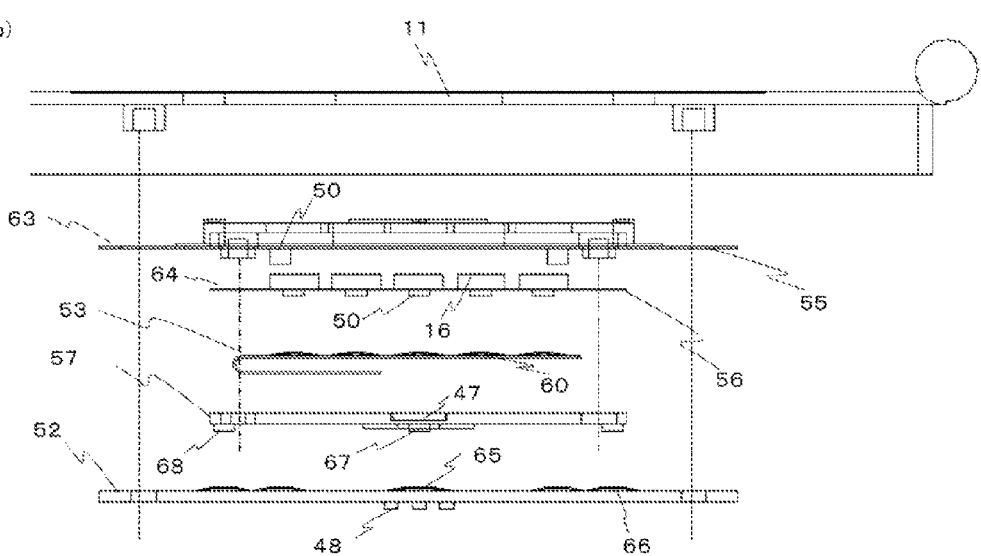

FIGS. 18 to 20 are drawings illustrating a structure of a composite switch according to a second example and a cellular phone with the same.

(a) of FIG. 18 and (b) of FIG. 19 are outer perspective views of the cellular phone according to the present example. (b) of FIG. 18 is an outer perspective view of the key structure in the present example. (c) of FIG. 18 and (a) of FIG. 19 are exploded outer perspective views of the key structure in the present example. (a) of FIG. 20 is an A-A cross sectional view of the structure shown in (b) of FIG. 19. (b) of FIG. 20 is an A-A cross sectional view of the structure shown in (b) of FIG. 19.

In the composite switch according to the present example, the circular center key 18 in the first example is replaced with a rectangular center key 18. In the composite switch according to the present example, rotation of the second key sheet 56 is suppressed because the center key 18 is rectangular.

Third Example

Figure 21:
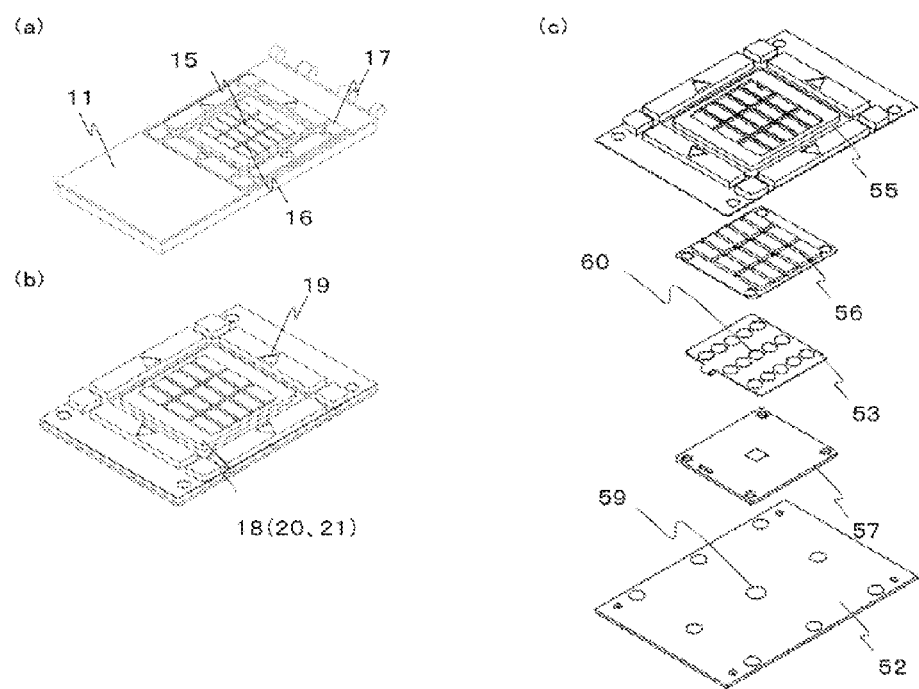
FIG. 21 is a diagram illustrating a structure of a composite switch according to a third example.
Figure 22:
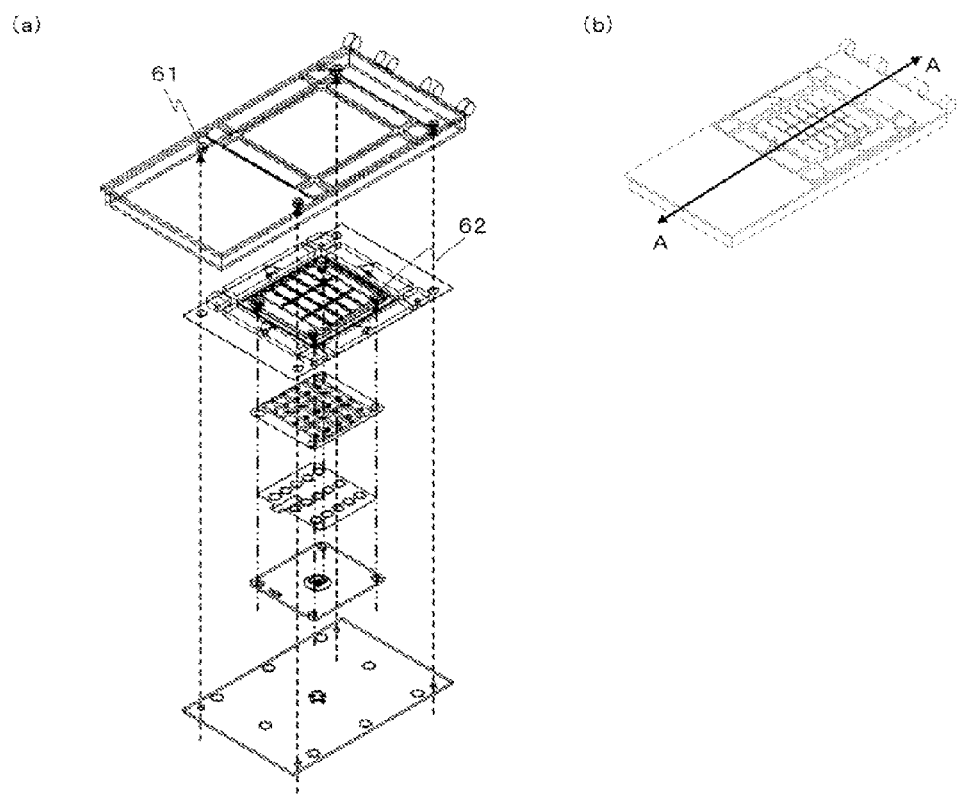
FIG. 22 is a diagram illustrating a structure of a composite switch according to a first example.
Figure 23:
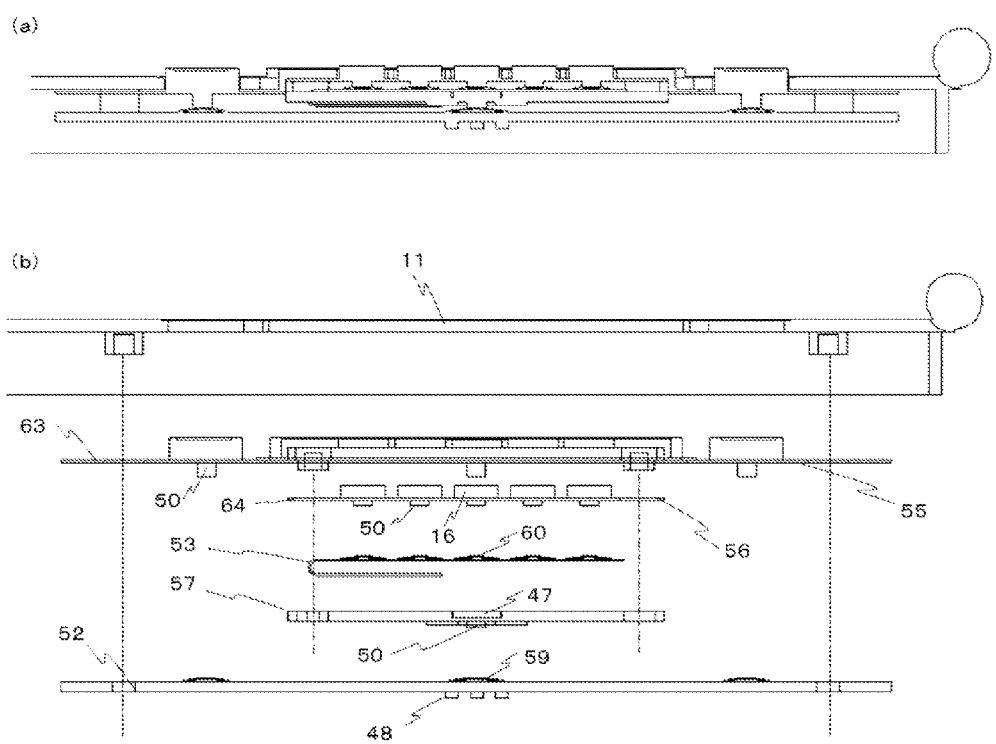
FIG. 23 is a diagram illustrating a structure of a composite switch according to a third example.

FIGS. 21 to 23 are drawings illustrating a composite switch according to a third example and a cellular phone with the same.

(a) of FIG. 21 and (b) of FIG. 22 are outer perspective views of the cellular phone in the present example. (b) of FIG. 21 is an outer perspective view of the key structure in the present example. (c) of FIG. 21 and (a) of FIG. 22 are exploded outer perspective views of the key structure in the present example. (a) of FIG. 23 is an A-A cross sectional view of the structure shown in the (b) of FIG. 22. (b) of FIG. 23 is an exploded A-A cross sectional view of the structure shown in (b) of FIG. 22.

The direction key 19, which is arranged within the center key 18 in the second example, is arranged outside the center key 18 in the composite switch according to the present example. In the composite switch according to the present example, rotation of the second key sheet 56 is suppressed because the center key is rectangular as in the second example.

Fourth Example

Figure 24:
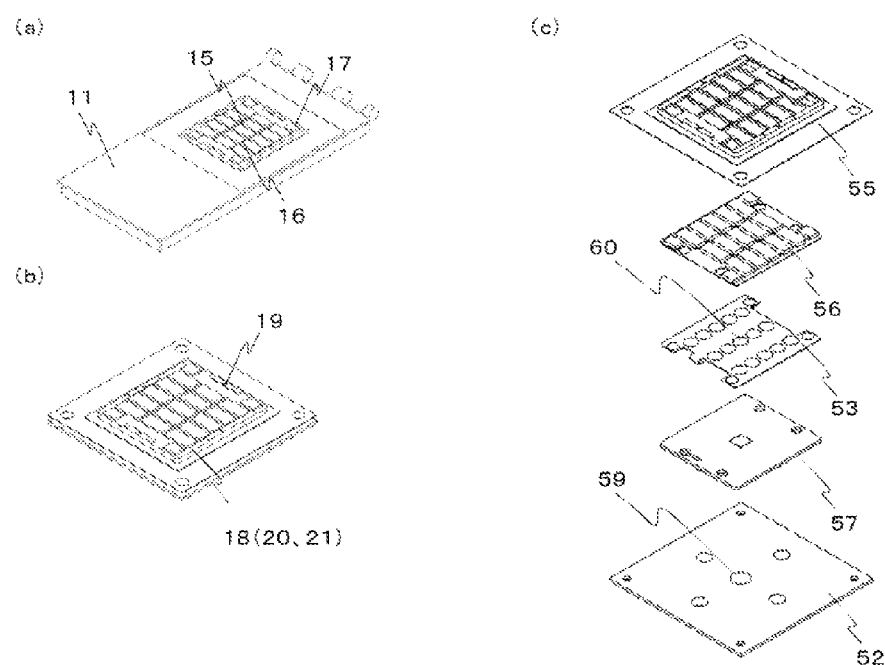
FIG. 24 is a diagram illustrating a structure of a composite switch according to a fourth example.
Figure 25:
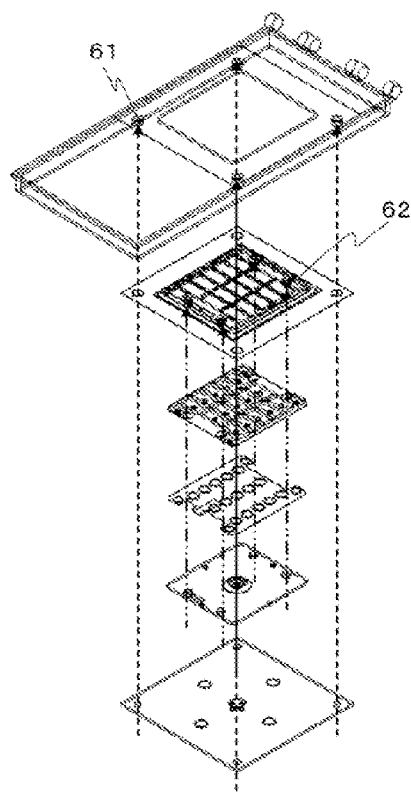
FIG. 25 is a diagram illustrating a structure of a composite switch according to a fourth example.
Figure 25:
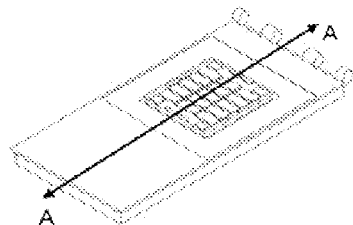
Figure 26:
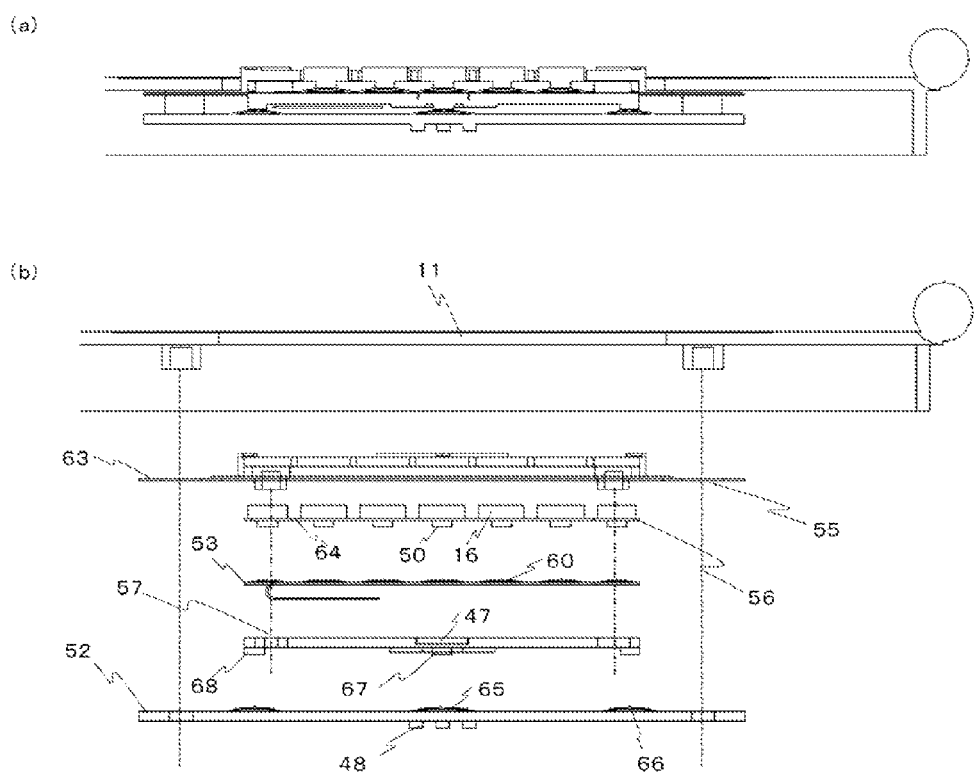
FIG. 26 is a diagram illustrating a structure of a composite switch according to a fourth example.
Figure 27:
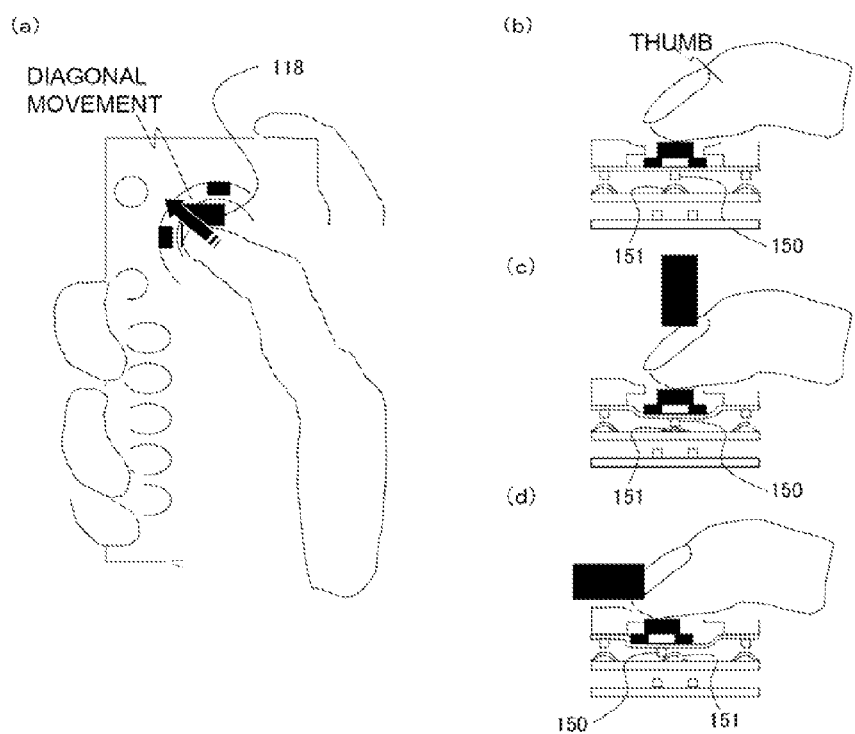
FIG. 27 is a diagram illustrating a sliding operation of an analog pointer on a center key of a conventional cellular phone.

FIGS. 24 to 26 are drawings illustrating a structure of a composite switch according to a fourth example and a cellular phone with the same.

(a) of FIG. 24 and (b) of FIG. 25 are outer perspective views of the cellular phone according to the present example. (b) of FIG. 24 is an outer perspective view of the key structure in the present example. (c) of FIG. 24 and (a) of FIG. 25 are exploded outer perspective views of the key structure in the present example. (a) of FIG. 26 is an A-A cross sectional view of the structure shown in (b) of FIG. 25. (b) of FIG. 26 is an exploded A-A cross sectional view of the structure shown in (b) of FIG. 25.

The menu key 17, which is arranged outside the center key 18 in the second example, are arranged within the center key 18 in the composite switch according to the present example. In the composite switch according to the present example, rotation of the second key sheet 56 is suppressed because the center key is rectangular as in the second example.

Fifth Example

A composite switch according to a fifth example and a cellular phone with the same are described with reference to the drawings. FIGS. 28 to 31 are drawings illustrating a structure of the composite switch according to the fifth example of the present example and the cellular phone with the same. It is to be noted that the cellular phone according to the present example and the cellular phone according to the first example (FIG. 10) are the same in their appearance.

Figure 28:
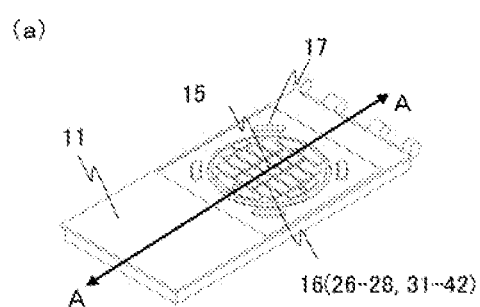
FIG. 28 is a diagram illustrating a structure of a composite switch according to a fifth example.
Figure 28:
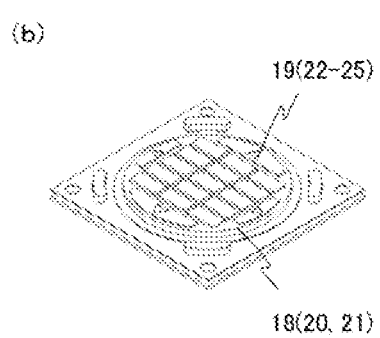

(a) of FIG. 28 is an outer perspective view of the cellular phone according to the present example. (b) of FIG. 28 is an outer perspective view of the key structure of the composite switch according to the present example. (a) of FIG. 29 is an A-A cross sectional view of the structure shown in (a) of FIG. 28.

The central metal dome 65 and the central projection 67 in the composite switch according to the first example ((b) of FIG. 12 and (c) of FIG. 16) are replaced with a metal dome attached with a projection on its top 69 and a board C 70, which are arranged under the intermediate base 57, in the composite switch according to the present example.

Figure 30:
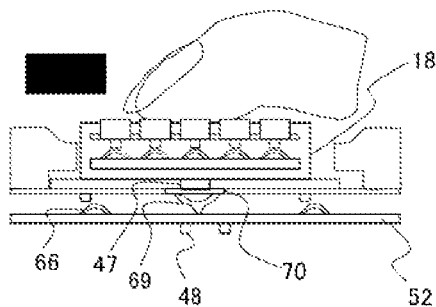
FIG. 30 is a diagram illustrating a structure of a composite switch according to a fifth example.
Figure 30:
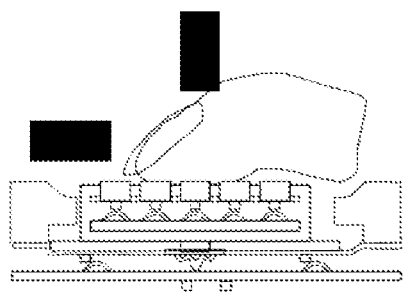

(b) of FIG. 29 illustrates a case in which the ten key 16 in the present example is operated. (c) of FIG. 29 illustrates a case in which a "confirm" key 21 in the present example is operated. (d) of FIG. 29 illustrates a case in which a direction key 19 in the present example is operated. (a) of FIG. 30 illustrates a case in which an analog pointer 20 in the present example is operated. (b) of FIG. 30 illustrates a case in which the "confirm" key 21 and the analog pointer 20 in the present example are operated simultaneously.

When using the "confirm" key 21 in the present example, if the center key 18 is pushed down, the metal dome attached with a projection 69 is deformed by the projection of its own to perform a contact operation on the board C 70 and confirm selection of an item on the display screen 13 of the housing B 12.

When using the analog pointer 20, if the center key 18 is slid to an arbitrary position on a plane of the housing A 11 while keeping the "confirm" key 21 pushed, the pointer 54 on the display screen 13 of the housing B 12 is moved to an arbitrary position thorough detection of the relative position between a permanent magnet 47 inside the center key 18 and a Hall device 48 (FIG. 14).

In this case, since the metal dome attached with a projection 69, along with the center key 18, slides while being deformed, it is possible to slide the selected item on the display screen 13 of the housing B 13 to an arbitrary position while keeping the confirmation of the selection. This function corresponds to a drug function (movement while clicking) thorough a mouse on a personal computer.

It is also possible to push the "confirm" key 21 while sliding the center key 18 to an arbitrary position by the composite switch according to the present example.

Figure 31:
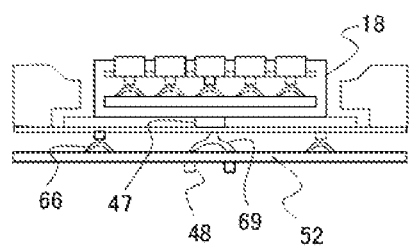
FIG. 31 is a diagram illustrating a structure of a composite switch according to a fifth example.
Figure 31:
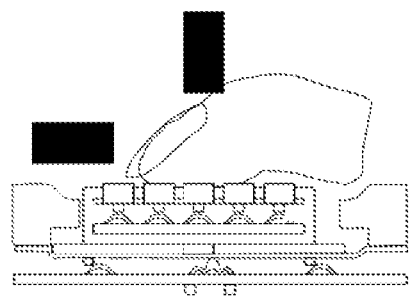

(a) of FIG. 31 illustrate the composite switch according to the present example, in which the metal dome attached with a projection 69 is arranged on the board A 52.

(b) of FIG. 31 illustrates a case in which the "confirm" key 21 and the analog pointer 20 are simultaneously operated in the composite switch according to the present example.

In this case, since the metal dome attached with a projection 60 keeps the deformed state even when the center key 18 is slid, it is possible to slide a selected item on the display screen 13 of the housing B 12 to an arbitrary position while keeping the selection of an item.

It is also possible to push the "confirm" key 21 while sliding the center key 18 to an arbitrary position.

It is to be noted that not only the central metal dome 65 but also the peripheral metal domes 66 in the composite switch according to the first example ((b) of FIG. 12) may be replaced with metal domes attached with a projection.

Sixth Example

Figure 33:
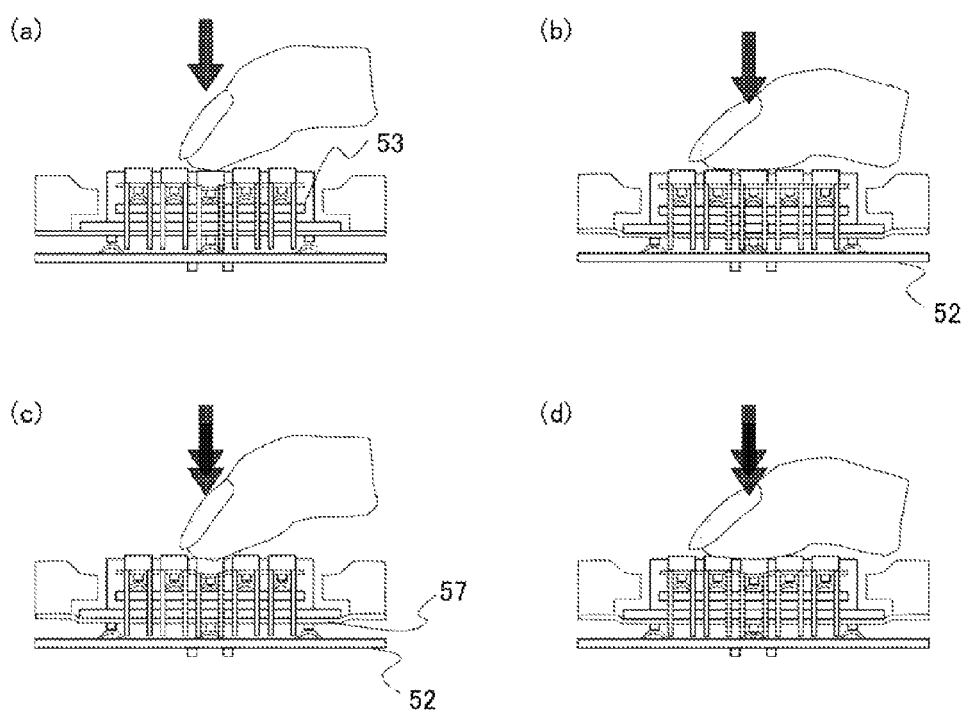
FIG. 33 is a diagram illustrating an operation of a composite switch according to a sixth example.

A composite switch according to a sixth example and a cellular phone with the same are described with reference to the drawings. FIG. 33 is a drawing illustrating a structure of the composite switch according to the sixth example and the cellular phone with the same. It is to be noted that the cellular phone according to the present example and the cellular phone according to the first example (FIG. 10) are the same in their appearance.

Figure 32:
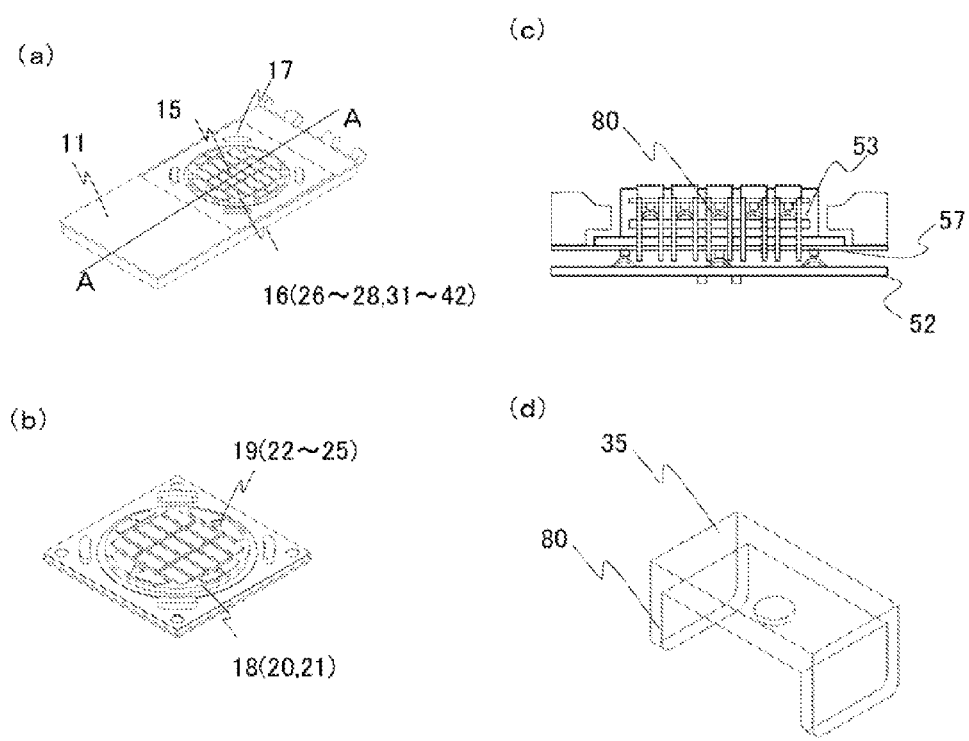
FIG. 32 is a diagram illustrating a structure of a composite switch according to a fifth example.

(a) of FIG. 32 is a perspective view of the cellular phone according to the present example. (b) of FIG. 32 is an outer perspective view of the key structure of the composite switch according to the present example. (c) of FIG. 32 is an A-A cross sectional view of the structure shown in (a) of FIG. 32. (d) of FIG. 32 is a perspective view of a ten key structure with a stopper.

Referring to (c) of FIG. 32, the ten key 16 in the composite switch according to the first example ((b) of FIG. 12 and (a) of FIG. 16) is replaced with a ten key with a stopper, which comprises a stopper 80 that develops from the bottom of the ten key and almost reaches the board A 52, and each of the board B 53 and intermediate base 57 has a hole, thorough which the stopper 80 passes.

Referring to (d) of FIG. 32, in the ten key with a stopper in the composite switch according to the present example, the stopper 80 with a rectangular cross section is provided integrally with the ten key 16 under short sides of the rectangular ten key 16.

Figure 34:
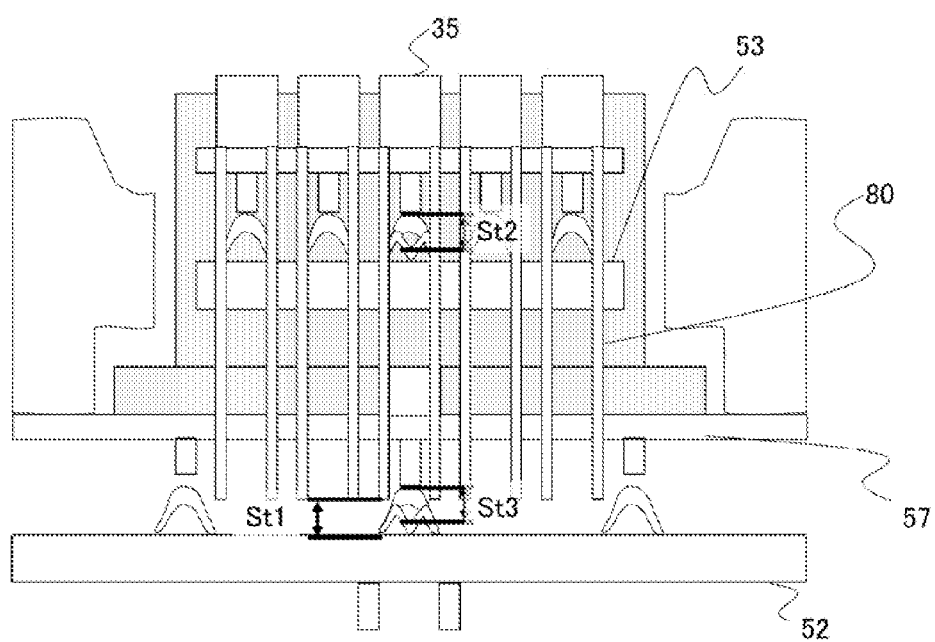
FIG. 34 is a diagram illustrating a stopper in a composite switch according to a sixth example.

(a) and (b) of FIG. 33 illustrate a case in which a "5" key 35 of the ten key with a stopper in the present example is operated. (c) and (d) of FIG. 33 illustrate an operation of a "confirm" key 21 in a case where the ten key is a ten key with a stopper. FIG. 34 is a drawing illustrating the condition under which the stopper 80 operates.

When using the "5" key 35 in the present example, if the "5" key 35 is pushed down, the metal dome just under the "5" key 35 of the metal dome array B 60 arranged on the board B 53 is deformed by the projection 50 just under the "5" key and a contact operation is performed ((a) of FIG. 33).

If the "5" key 35 is pushed down further, the center key 18 begins to be pushed down. However, when the stopper 80 hits the board A 52, the center key ceases to be pushed down further.

Therefore, since the central metal dome 65 arranged on the board A 52 is not deformed by the projection 67 of the intermediate base 57, the "confirm" key does not perform a contact operation.

Referring to FIG. 34, the following condition must be satisfied in order to provide the above effect through the stopper 80: a stroke (St1) when the stopper 80 hits the board A 52 is longer than a stroke (St2) when the metal dome just under the "5" key is clicked (St2<St1); and a stroke (St3) when the central metal dome 65 just under the "confirm" key 21 is clicked is longer than a stroke (St1−St2) of the center key 18 after the metal dome just under the "5" key 35 is deformed (St1−St2<St3).

The stopper 80 satisfying this condition prevents the "confirm" key 21 from being pushed down when the "5" key 35 is pushed down.

When using the "confirm" key 21 in the present example, if the "center" key 18 is pushed down, the central metal dome 65 arranged on the board A 52 is deformed by the central projection 67 on the intermediate base 57 and a contact operation is performed ((c) of FIG. 33).

If the "5" key 35 is pushed down while keeping the "confirm" key 21 to be pushed down, the stopper 80 hits the board A 52. Therefore, the "5" key 35 ceases to be pushed down further ((d) of FIG. 33).

Since the metal dome just under the "5" key of the metal dome array B 60 arranged on the board B 53 is not deformed by the projection 50 just under the "5" key 35, the "5" key 35 does not perform a contact operation.

Referring to FIG. 34, the following condition must be satisfied in order to provide the above effect through the stopper 80: a stroke (St1) when the stopper 80 hits the board A 52 is longer than a stroke (St3) when the central metal dome 65 just under the "confirm" key 21 is clicked (St3<St1); and a stroke (St2) when the metal dome just under the "5" key 35 is clicked is longer than a stroke (St1−St3) of the center key 18 after the central metal dome just under the "confirm" key 21 is deformed (St1−St3<St2).

The stopper 80 satisfying this condition prevents the "5" key 35 from being pushed down when the "confirm" key 21 is pushed down.

The same effect is provided when the stopper 80 is arranged on the board A 52 instead of the ten key 16 and configured to hit the ten key 16.

Figure 35:
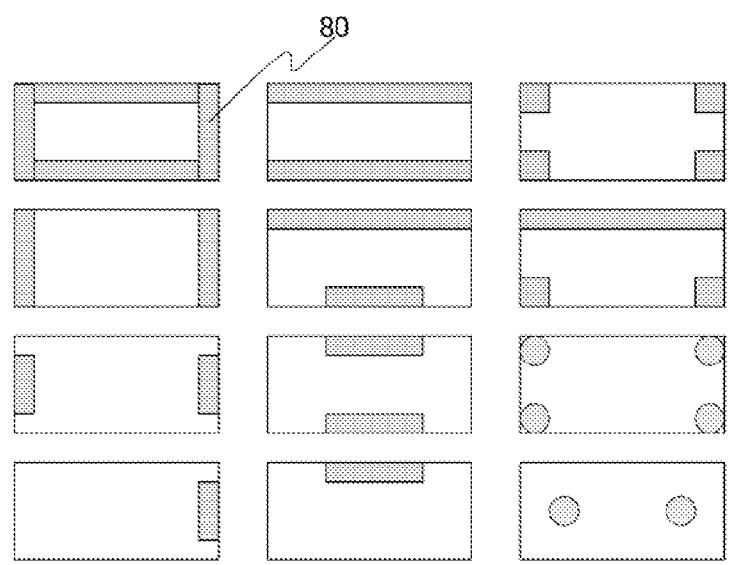
FIG. 35 is a diagram illustrating variations of the form of a stopper in a composite switch according to a sixth example.

As shown in FIG. 35, the cross section of the stopper 80 may be an arbitrary shape such as a rectangle, circle, ellipse, triangle, star, shape with an arbitrary free curve etc. Moreover, the stopper 80 may be arranged at all sides, two facing sides, one side, part of a side, four corners, interior, etc. of the ten key 16.

It is not necessary to provide the stopper 80 to all keys of the ten key 16. The stopper 80 may be provided to part of the ten key 16.

The stoppers 80 may have various heights.

The shape of the ten key 16 is not limited to a rectangle. The shape may be arbitrary. As an example, the shape of the ten key may be a rectangle, circle, ellipse, triangle, star, shape with an arbitrary free curve etc.

The following various modifications can be made to the above first to sixth examples.

The analog pointer 20 in the first to sixth examples may be a "jog". The analog pointer 20 in the first to sixth examples may be based on optics, strain, or piezoelectricity. The analog pointer in the first to sixth examples may be omitted. The direction key 19 in the first to sixth example may be a "jog". The shape of the center key 18 in the first to sixth examples may be an arbitrary shape such as an ellipse, triangle, star, shape with an arbitrary free curve etc. The contact scheme of the key in the first to sixth examples may be a capacitive scheme (capacitive sensor for example) or a piezoelectric scheme (pressure sensitive conductive rubber sheet for example). The direction key 19 arranged on the center key 18 in the first and second examples may have the same key structure (separation of keys, projection from the elastomer B 64, floor on which metal domes are arranged) as the ten key 16 arranged within the center key 18. The material of the stopper 80 in the sixth example may be resin, rubber or metal in order to be formed integrally with the ten key. The stopper 80 in the sixth example may be provided integrally with the elastomer B 64 under the elastomer B 64 instead of being provided under the ten key 16.

Although the above description has been made with reference to examples, it is to be understood that the present invention is not limited to these examples.

INDUSTRIAL APPLICABILITY

The composite switch according to the present invention may be applicable to a portable device such as a cellular phone. The composite switch according to the present invention may also be applicable to a portable electronic device such as a portable game device, portable computer, portable music player, etc.

It should be noted that the content disclosed in Patent Document 1 is hereby incorporated by reference.

In the framework of entire disclosure of the present invention (including the claims), and based on its basic technological idea, exemplary embodiments or examples of the present invention may be changed and/or adjusted. Also it should be noted that in the framework of the claims of the present invention, any combinations or selections of various elements disclosed herein are possible. That is, needless to say, it is understood by those skilled in the art that various changes or modifications can be made to the present invention based on the disclosure of the present invention including the claims and the technological idea of the present invention.

What is claimed is:

1. A composite switch comprising:
   a first switch that is actuable by applying a first load to a first key;
   a second switch that is actuable by applying a second load to a second key; and
   a stopper to prevent the first key from being pressed down when the second key is pressed down to perform a contact operation in the second switch, and
   a plurality of projections, wherein a first projection deforms a first flexible member from among a plurality of first flexible members, wherein the first flexible member is located at a center region of the plurality of the first flexible members and the first projection has a height in a direction of a deformation that is longer than a height of a second projection, wherein the second projection deforms a second flexible member from among the plurality of the first flexible members, and the second flexible member located at a position not in the center region of the plurality of first flexible members; wherein
   a keytop of the second key is disposed on a keytop of the first key;
   the second key is disposed on the first key, and
   a stroke St1 of the stopper, a stroke St2 of the second key, and
   a stroke St3 of the first key satisfy following relations St2<St1 and (St1−St2)<St3.

2. The composite switch according to claim 1, wherein the first key is:
   elastically connected to a housing by a first elastic member, movable in both a parallel and a perpendicular direction relative to a first plane of the housing on which the first key is disposed, and rotatable about an axis extending parallel to the first plane; and
   the second key is:
   elastically connected to the first key by a second elastic member, and
   movable in a direction perpendicular to a pushing surface of the first key.

3. The composite switch according to claim 1, further comprising:
   a plurality of second flexible members, wherein each of the plurality of the second flexible members performs a second contact operation in the second switch by changing its shape upon application of the second load to the second key, and
   wherein each of the plurality of the first flexible members performs a first contact operation in the first switch by changing its shape upon application of the first load to the first key.

4. The composite switch according to claim 3, wherein:
   the plurality of first flexible members is disposed on a first board; and
   the plurality of second flexible members is disposed on a second board that is parallel to the first board.

5. The composite switch according to claim 3, wherein said each of the plurality of the first flexible members is dome-shaped; and
   the first flexible member from among the plurality of the first flexible members, which is located at the center region of the plurality of the first flexible members, has a higher dome height than the second flexible member from among the plurality of the first flexible members.

6. The composite switch according to claim 3, wherein the first key includes an analog pointer and a confirm key; and
the confirm key is actuated by deforming the first flexible member from among the plurality of the first flexible members located at the center region of the plurality of the first flexible members.

7. The composite switch according to claim 3, wherein the first key includes a direction key; and the direction key is actuated by deforming the first flexible member from among the plurality of the first flexible members that is not located at the center region of the plurality of the first flexible members.

8. The composite switch according to claim 3, further comprising a third key that is connected to the first key by an elastic member and is located around the first key, wherein
the third key includes a menu key; and
the menu key is actuated by deforming the first flexible member from among the plurality of the first flexible members that is not located at the center region of the plurality of the first flexible members.

9. The composite switch according to claim 3, wherein at least one of the plurality of the first flexible members and the plurality of the second flexible members is a metal dome.

10. The composite switch according to claim 3, wherein at least one of the plurality of the first flexible members located at the center region of the plurality of the first flexible members is a metal dome, wherein the metal dome includes a projection located at an apex region of the metal dome.

11. The composite switch according to claim 10, wherein the metal dome is disposed on a third board, and the third board faces a first board, so that the projection faces toward the first board.

12. The composite switch according to claim 1, wherein the second load is less than the first load.

13. The composite switch according to claim 1, wherein the second key includes a ten key.

14. The composite switch according to claim 13, wherein the ten key is located at a center region of the first key; and
a direction key is arranged around the ten key.

15. The composite switch according to claim 1, wherein the stopper is disposed on a bottom region of the second key and the stopper touches a first board when the second key is pressed down to perform the contact operation in the second switch.

16. The composite switch according to claim 1, wherein the stopper is disposed on a first board and the stopper touches the second key when the second key is pressed down to perform the contact operation in the second switch.

17. A composite switch comprising:
a first switch that includes a first key pressed down by a first load;
a second switch that includes a second key pressed down by a second load; and
a stopper to prevent the first key from being pressed down when the second key is pressed down to perform a contact operation in the second switch, and
a plurality of projections, wherein a first projection deforms a first flexible member from among a plurality of first flexible members, wherein the first flexible member located at a center region of the plurality of the first flexible members and the first projection has a height in a direction of a deformation that is longer than a height of a second projection, wherein the second projection deforms a second flexible member from among the plurality of the first flexible members, and the second flexible member located at a position not in the center region of the plurality of the first flexible members; wherein
a keytop of the second key is disposed on a keytop of the first key;
the second key is disposed on the first key, and
a stroke St1 of the stopper, a stroke St2 of the second key, and a stroke St3 of the first key satisfy the following relations St2<St1 and (St1−St2)<St3.

* * * * *